United States Patent
Fung et al.

(10) Patent No.: US 7,257,795 B1
(45) Date of Patent: Aug. 14, 2007

(54) METHOD AND APPARATUS FOR FACILITATING EFFECTIVE AND EFFICIENT OPTIMIZATION OF SHORT-PATH TIMING CONSTRAINTS

(75) Inventors: Ryan Fung, Mississauga (CA); Michael Chan, Scarborough (CA)

(73) Assignee: Altera Corporation, San Jose, CA (US)

( * ) Notice: Subject to any disclaimer, the term of this patent is extended or adjusted under 35 U.S.C. 154(b) by 118 days.

(21) Appl. No.: 10/876,699

(22) Filed: Jun. 25, 2004

Related U.S. Application Data

(63) Continuation-in-part of application No. 10/774,883, filed on Feb. 9, 2004.

(51) Int. Cl.
*G06F 17/50* (2006.01)

(52) U.S. Cl. .............................. 716/12; 716/13; 716/16; 716/17

(58) Field of Classification Search .................... 716/4; 326/39, 41
See application file for complete search history.

(56) References Cited

U.S. PATENT DOCUMENTS

| | | | | |
|---|---|---|---|---|
| 5,212,652 A | * | 5/1993 | Agrawal et al. | 326/41 |
| 5,260,611 A | * | 11/1993 | Cliff et al. | 326/39 |
| 5,815,003 A | * | 9/1998 | Pedersen | 326/39 |
| 6,130,551 A | * | 10/2000 | Agrawal et al. | 326/39 |
| 6,181,163 B1 | * | 1/2001 | Agrawal et al. | 326/41 |

* cited by examiner

*Primary Examiner*—Leigh M. Garbowski
(74) *Attorney, Agent, or Firm*—L. Cho

(57) ABSTRACT

Methods and apparatuses are disclosed to facilitate routing between a first and second component in a programmable logic device to generate a path with an appropriate amount of delay to satisfy short-path timing constraints efficiently and effectively.

34 Claims, 24 Drawing Sheets

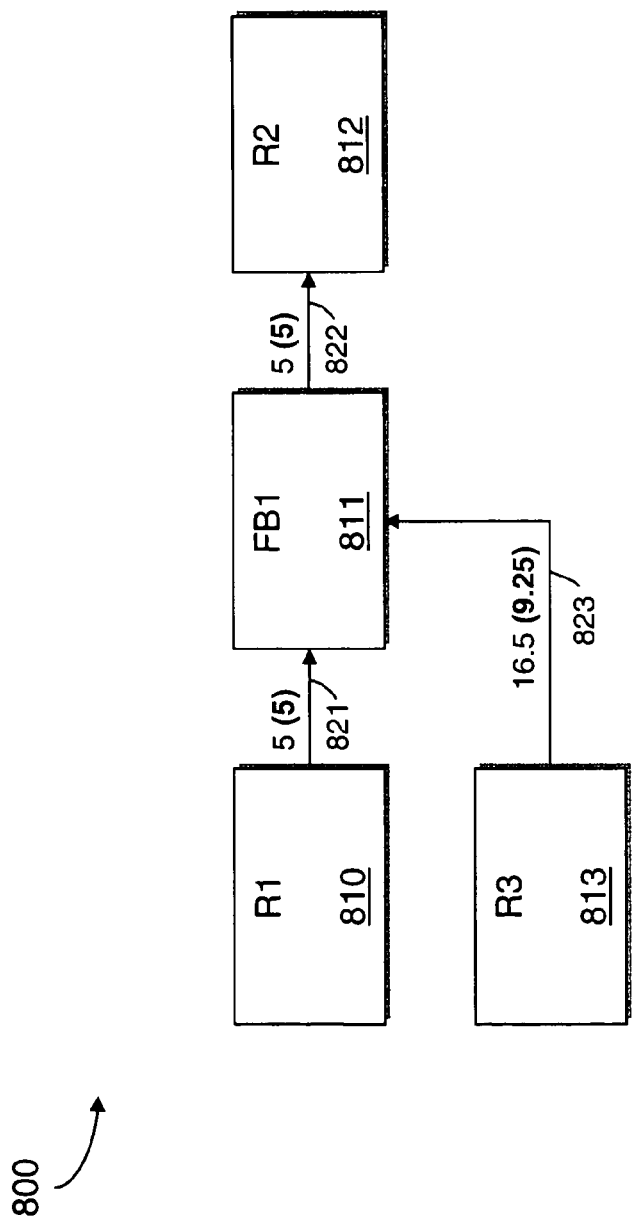

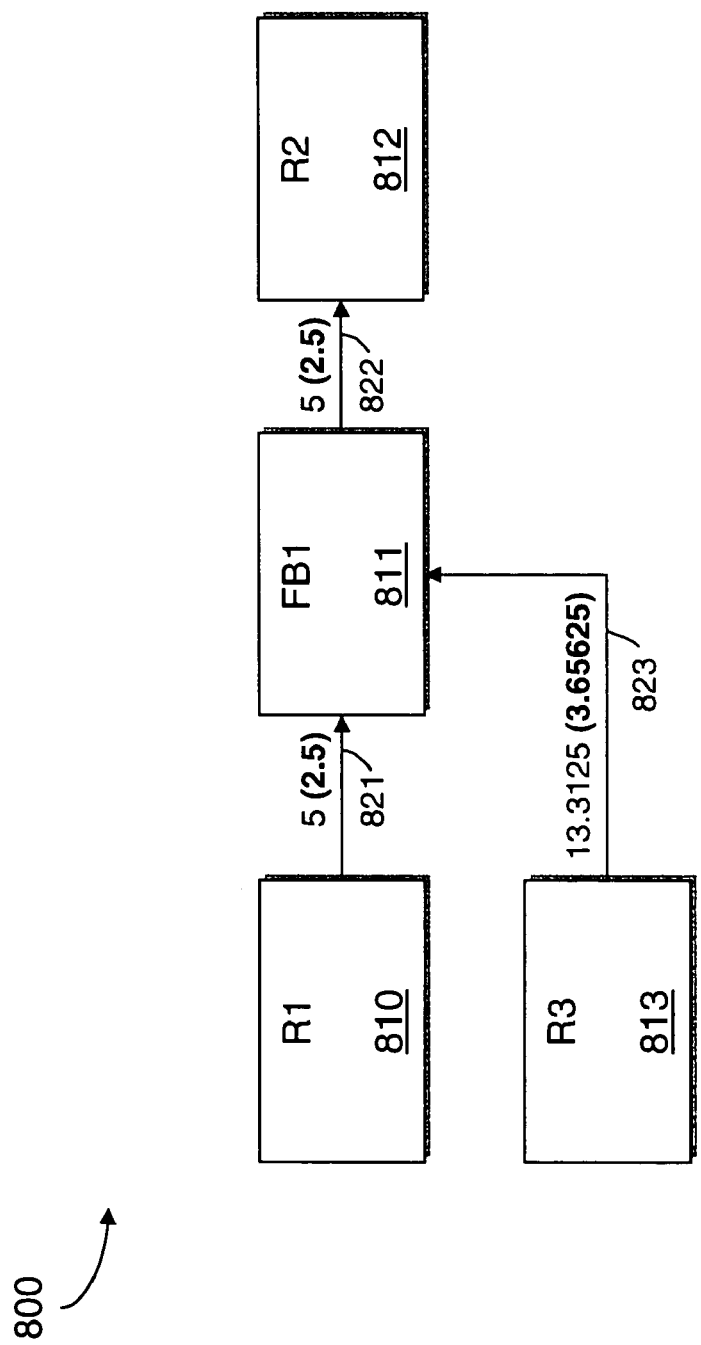

METHOD AND APPARATUS FOR FACILITATING EFFECTIVE AND EFFICIENT OPTIMIZATION OF SHORT-PATH TIMING CONSTRAINTS

RELATED APPLICATIONS

This application is a continuation-in-part of, and claims the benefit under Title 35, United States Code, Section 120 of co-pending U.S. application Ser. No. 10/774,883 filed on Feb. 9, 2004 and entitled "METHOD AND APPARATUS FOR UTILIZING LONG-PATH AND SHORT-PATH TIMING CONSTRAINTS IN AN ELECTRONIC DESIGN-AUTOMATION TOOL".

FIELD OF THE INVENTION

The present invention relates to field programmable gate arrays (FPGAs). More specifically, the present invention relates to a method and apparatus for facilitating effective and efficient optimization of short-path timing constraints in an FPGA.

BACKGROUND

Electronic designs may be large systems that include millions of gates and megabits of embedded memory. Of the tasks required in managing and optimizing electronic designs, synthesis, placement, and routing utilizing available resources can be among the most challenging and time consuming. The complexity of large systems often requires the use of electronic design automation (EDA) tools to manage and optimize designs. EDA tools perform the time-consuming tasks of synthesis, placement, and routing. Some EDA tools allow users to specify long-path timing constraints such as, for example, FMAX (maximum clocking frequency), TSU (setup time), and TCO (clock-to-output time), in order for designs to meet performance targets. Only recently have EDA tools taken into account short-path timing constraints.

Current FPGA architectures do not offer features specifically designed to improve the efficiency and effectiveness of short-path timing optimization in EDA tools. Consequently, it is difficult to add the right amount of delay to solve short-path timing constraints in the presence of other constraints of a system. For example, in order to add delay, wires are often wasted because routing patterns on an FPGA do not support a more efficient solution. In some instances, the appropriate delay within legal delay bounds may also not be achievable because the routing patterns on the FPGA may only support routes that have too little delay (causing a short-path timing violation) or too much delay (causing a long-path timing violation).

Thus, what is needed is a method and apparatus for facilitating the efficient and effective optimization of short-path timing constraints.

SUMMARY

According to an embodiment of the present invention, architectural features in an FPGA are employed to improve the efficiency and effectiveness of short-path timing optimization. In one embodiment, an FPGA provides a mixture of routing resources, such as wires, spanning similar distances but offering differing delays for routing. In a second embodiment, an FPGA provides a first routing resource capable of driving a second routing resource sub-optimally with respect to delay. For example, the routing resources may highly overlap so as to reduce the distance spanned. In a third embodiment, an FPGA provides a first routing resource capable of driving a second routing resource, where the routing resources transmit signals in opposing directions. In a fourth embodiment, an FPGA provides delay chains throughout the core of the FPGA. For example, the delay chain may be positioned at the inputs and outputs of logic elements. These features allow for the slowing down of signals on routes, resulting in less wasted routing resources.

BRIEF DESCRIPTION OF THE DRAWINGS

The features and advantages of the present invention are illustrated by way of example and are by no means intended to limit the scope of the present invention to the particular embodiments shown, and in which:

FIGS. 8(a)-(k) illustrate an example of how minimum and maximum connection delay budgets are determined from long-path and short-path path-level timing constraints according to an embodiment of the present invention;

DETAILED DESCRIPTION

Figure 1:
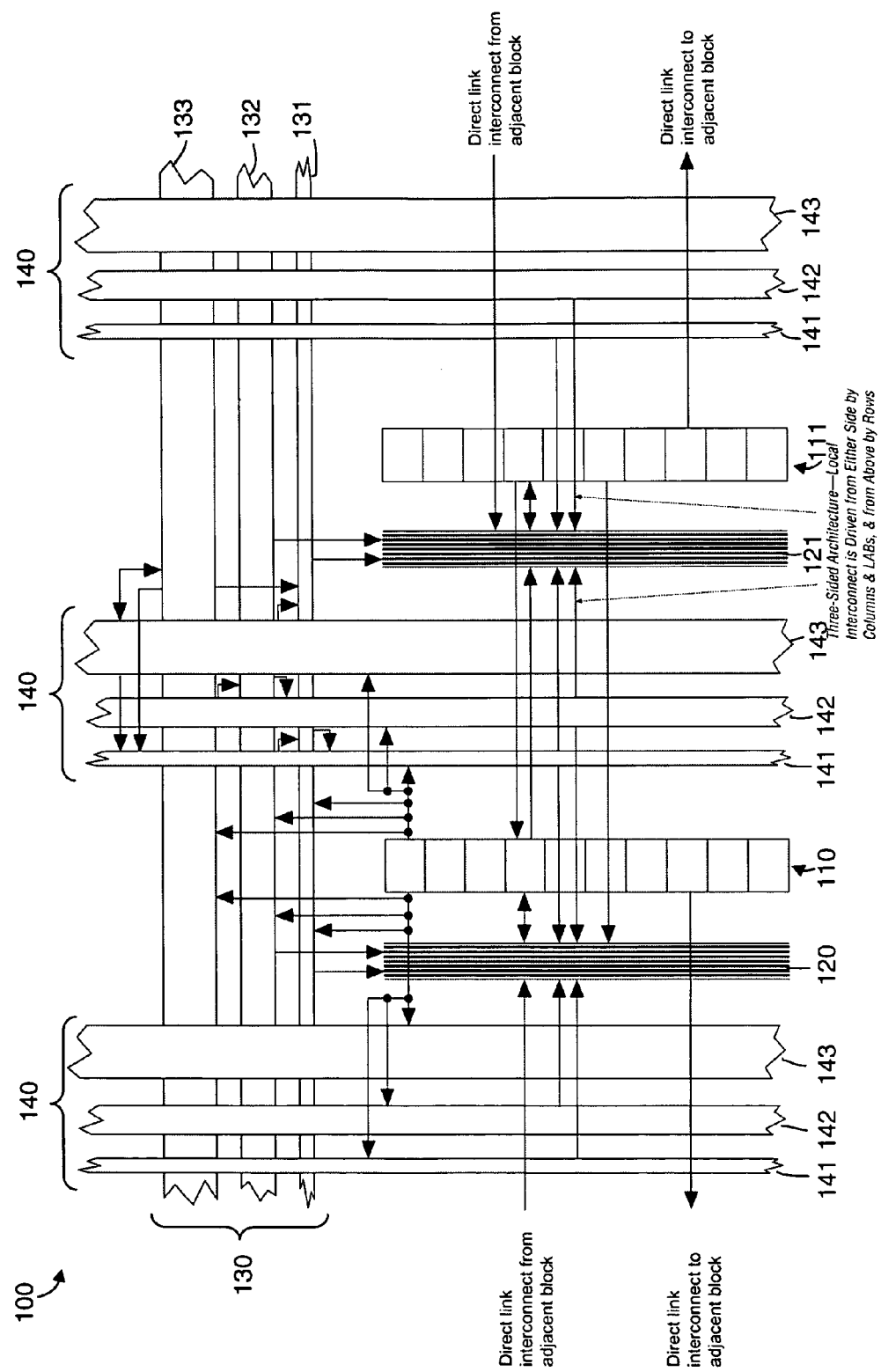
FIG. 1 illustrates an FPGA according to an embodiment of the present invention.

FIG. 1 illustrates an exemplary target device 100 (FPGA) according to an embodiment of the present invention. The present invention may be implemented on the target device 100. According to one embodiment, the target device 100 is a chip having a hierarchical structure that may take advantage of wiring locality properties of circuits formed therein. The lowest level of the hierarchy is a logic element (LE) (not shown). An LE is a small unit of logic providing efficient implementation of user logic functions. According to one embodiment of the target device 100, an LE may include a 4-input lookup table (LUT) with a configurable flip-flop.

The target device 100 includes a plurality of logic-array blocks (LABs). Each LAB is formed from 10 LEs, LE carry chains, LAB control signals, LUT chain, and register chain connection lines. LUT chain connections transfer the output of one LE's LUT to the adjacent LE for fast sequential LUT connections within the same LAB. Register chain connection lines transfer the output of one LE's register to the adjacent LE's register within a LAB. LABs are grouped into rows and columns across the target device 100. A first column of LABs is shown as 110 and a second column of LABs is shown as 111.

The target device 100 includes memory blocks (not shown). The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 100.

The target device 100 includes digital signal processing (DSP) blocks (not shown). The DSP blocks may be used to implement multipliers of various configurations with add or subtract features. The DSP blocks include shift registers, multipliers, adders, and accumulators. The DSP blocks may be grouped into columns across the target device 100.

The target device 100 includes a plurality of input/output elements (IOEs) (not shown). Each IOE feeds an I/O pin (not shown) on the target device 100. The IOEs are located at the end of LAB rows and columns around the periphery of the target device 100. Each IOE includes a bidirectional I/O buffer and a plurality of registers for registering input, output, and output-enable signals. When used with dedicated clocks, the registers provide performance and interface support with external memory devices, for example.

The target device 100 includes LAB local interconnect lines 120-121 that transfer signals between LEs in the same LAB. Some LAB local interconnect lines are driven by column and row interconnects and LE outputs within the same LAB. Neighboring LABs, memory blocks, IOEs, or DSP blocks may also drive the LAB local interconnect lines 120-121 through direct link connections.

The target device 100 also includes a plurality of row non-local interconnect lines ("H-type wires") 130 that span fixed distances. Row interconnect lines 130, that include H4 131, H8 132, and H24 133 interconnects, may be used to route signals to and from LABs, DSP blocks, IOEs, and memory blocks within the same row. The H4 131, H8 132, and H24 133 interconnects span a distance of up to four, eight, and twenty-four logical units respectively. The row interconnects 130 may drive and be driven by LABs, DSP blocks, RAM blocks, and horizontal IOEs.

The target device 100 also includes a plurality of column non-local interconnect lines ("V-type wires") 140 that operate similarly to the row interconnect lines 130. The column interconnect lines 140 may be used to vertically route signals to and from LABs, memory blocks, DSP blocks, and IOEs. These column interconnect lines 140 include V4 141, V8 142, and V16 143 interconnects that traverse a distance of four, eight, and sixteen logical units respectively, in a vertical direction.

In general, the distinction between local and non-local interconnect is that local interconnect lines only span one logical location, while non-local interconnect lines span more than one logical location.

FIG. 1 illustrates an exemplary embodiment of a target device. It should be appreciated that a system may include a plurality of target devices, such as that illustrated in FIG. 1, cascaded together. It should also be appreciated that the target device may include programmable logic devices arranged in a manner different than that on the target device 100. A target device may also include components other than those described in reference to the target device 100. Thus, while the invention described herein may be utilized on the architecture described in FIG. 1, it should be appreciated that it may also be utilized on different architectures, such as those employed by Altera® Corporation in its APEX™, Mercury™, Stratix™, and Stratix™ II families of chips and those employed by Xilinx®, Inc. in its Virtex™ and Virtex™ II line of chips.

Figure 2:
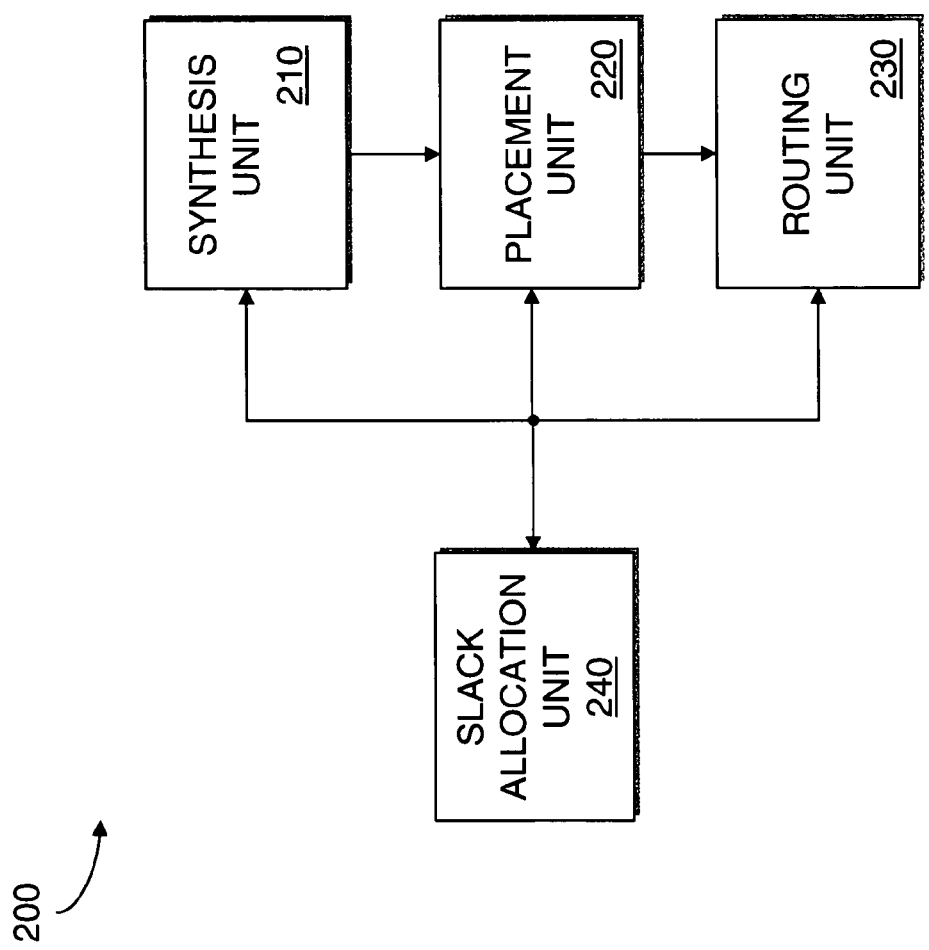
FIG. 2 illustrates a system designer according to an embodiment of the present invention.

FIG. 2 illustrates a system designer 200 according to an embodiment of the present invention. The system designer 200 may be an EDA tool. FIG. 2 illustrates software modules implementing an embodiment of the present invention. According to one embodiment, system design may be performed by a computer system (not shown) executing sequences of instructions represented by the software modules shown in FIG. 2. Execution of the sequences of instructions causes the computer system to support system design as will be described hereafter. In alternate embodiments, hard-wire circuitry may be used in place of or in combination with software instructions to implement the present invention. Thus, the present invention is not limited to any specific combination of hardware circuitry and software.

Block 210 represents a synthesis unit. The synthesis unit 210 generates a logic design of a system to be implemented by the target device 100 (shown in FIG. 1). According to an embodiment of the system designer 200, the synthesis unit 210 takes a conceptual Hardware Description Language (HDL) design definition and generates an optimized logical representation of the system. The optimized logical representation of the system generated by the synthesis unit 210 may include a representation that has a minimized number of components such as functional blocks and registers required for the system. Alternatively, the optimized logical representation of the system generated by the synthesis unit 210 may include a representation that has a reduced depth of logic and that generates a lower signal propagation delay. The synthesis unit 210 also determines how to implement functional blocks and registers in the optimized logic representation utilizing specific resources on the target device 100 thus creating an optimized "technology-mapped" netlist. The technology-mapped netlist illustrates how the resources on the target device 100 are utilized to implement the system. The technology-mapped netlist may, for example, contain components such as LEs on the target device 100.

Block 220 represents a placement unit 220. The placement unit 220 fits the system on the target device 100 by determining which resources on the target device 100 are to be used for specific functional blocks and registers. According to an embodiment of the system designer 200, the placement unit 220 first determines how to implement portions of the optimized logic design in clusters. Clusters may represent a subset of the components on the target device 100 such as, for example, a LAB having 10 LEs. In this embodiment, after portions of the optimized logic design are implemented in clusters, the clusters may be placed by assigning the clusters to specific LABs on the target device 100. Following the placement of the clusters, routing interconnections between the LEs may be performed. The placement unit 220 may utilize a cost function in order to determine a good assignment of resources on the target device 100.

Block 230 represents a routing unit 230. The routing unit 230 determines the routing resources on the target device 100 to use to provide interconnection between the functional blocks and registers on the target device 100.

Block 240 represents a slack allocation unit 240. The slack allocation unit 240 receives data such as path-level long-path timing constraints and short-path timing constraints from a user. Long-path timing constraints may include, for example, maximum register-to-register delays in a clock domain, I/O TSU requirements, and I/O TCO requirements. Short-path timing constraints may include, for example, TH (hold-time) requirements, minimum TPD (minimum propagation delay) requirements, and minimum I/O TCO (clock-to-output) requirements. The slack allocation unit 240 may also receive an achievable delay estimate, a lower delay limit, and an upper delay limit for each connection between functional blocks and registers on the target device 100 from one or more of the synthesis unit 210, placement unit 220, and routing unit 230. From this information, the slack allocation unit determines minimum and maximum delay budgets for each connection.

The synthesis unit 210, placement unit 220, and/or routing unit 230 may utilize the minimum and maximum delay budgets generated by the slack allocation unit 240 to determine a solution that satisfies long-path and short-path timing constraints. For example, the synthesis unit 210 may utilize a synthesis strategy that adds or removes levels of logic, uses slower or faster variants of a functional block, technology maps into faster or slower standard logic structures (such as carry chains), and/or uses faster or slower logic inputs based on the minimum and maximum delay budgets. The placement unit 220 may utilize a placement strategy that places functional blocks so they can (or are forced to) use slower/faster dedicated routing resources, and/or places functional blocks at appropriate distances from other functional blocks, based on the minimum and maximum delay budgets. The routing unit 230 may utilize a routing strategy that requires more or less routing resources, slower or faster routing resources, and delay chains (or additional buffers) based on the minimum and maximum delay budgets.

Figure 3:
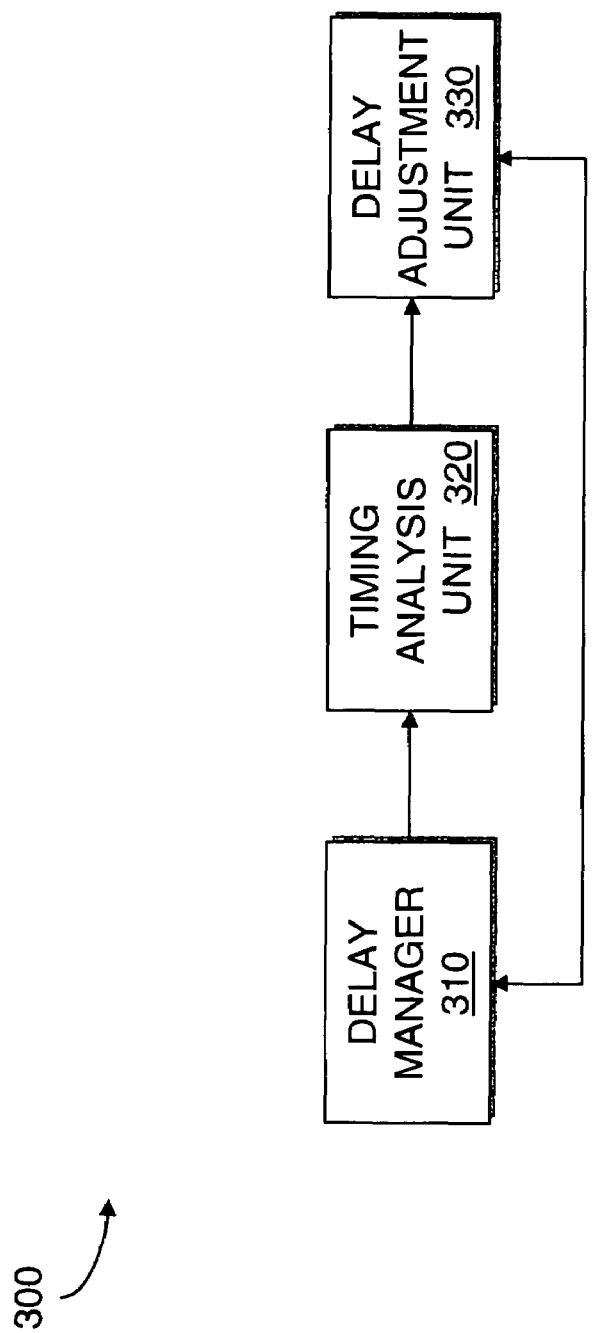
FIG. 3 is a block diagram of a slack allocator unit according to an embodiment of the present invention.

FIG. 3 is a block diagram illustrating a slack allocation unit 300 according to an embodiment of the present invention. The slack allocation unit 300 may be used to implement the slack allocation unit 240 illustrated in FIG. 2. The slack allocation unit 300 includes a delay manager 310. The delay manager 310 receives achieved delays, lower delay limits, and upper delay limits from one or more of the synthesis unit 210, placement unit 220, and routing unit 230 (shown in FIG. 2). According to an embodiment of the slack allocation unit 300, an achievable delay for a connection represents an estimate of the delay that will be finally incurred, in the final programmed FPGA, transmitting a signal between functional blocks. The achievable delay, being a realistic and "achievable" delay, may lie somewhere between the lower and upper delay limits. Lower delay limits represent lower bounds for delays on connections. For example, the placement unit 220 (shown in FIG. 2) may set a lower delay limit on a connection if an FPGA floor plan prevents two functional blocks from getting closer than a certain distance. Upper delay limits represent upper bounds for delays on connections. For example, the routing unit 230 may set an upper delay limit on a connection if the connection requires dedicated routing resources having a fixed delay. The delay manager 310 initially sets the achieved delays as the temporary delays for the connections and updates the temporary delays as the slack allocation unit 300 operates.

The slack allocation unit 300 includes a timing analysis unit 320. The timing analysis unit 320 receives the temporary delays, upper delay limits, and lower delay limits for the connections, short-path and long-path timing constraints for paths, and the logical design to be implemented by the target device 100 (shown in FIG. 1). The timing analysis unit 320 generates short-path and long-path slack numbers for each connection. According to one embodiment, a positive slack number for a connection indicates how much the delay on the connection in isolation can change before a worst-case path through that connection just meets its timing constraints. A negative slack number for a connection indicates how much the delay on the connection needs to change in order for that connection to meet its timing constraint. For example, a long-path slack number of 2 ns on a connection indicates that 2 ns of delay can be added to that connection before the worst-case path through that connection starts to violate its long-path timing constraint.

The slack allocation unit 300 includes a delay adjustment unit 330. The delay adjustment unit 330 operates to change the temporary delay for a connection in response to the short-path and long-path slack numbers for the connection. According to an embodiment of the slack allocation unit 300, the delay adjustment unit 330 first attempts to change the temporary connection delays until the short-path and long-path timing constraints are all met. In some cases, not all short-path and long-path timing constraints can be simultaneously met. In that case, this embodiment tries to achieve balanced failure (so no particular constraint is favoured in a set of competing constraints). After the temporary delays represent an assignment of delays that satisfy (or, in the case of very difficult constraints, for which the algorithm cannot find a solution that satisfies all constraints, come as close to satisfying the constraints as possible) all short-path and long-path timing constraints, the minimum and maximum delay budgets are determined. Unit 330 allocates and removes delay based on new positive long-path and short-path slack values re-computed by the timing analysis unit 320 in order to determine minimum and maximum delay budgets.

It should be appreciated that the synthesis unit 210, placement unit 220, routing unit 230, and slack allocation unit 240 in FIG. 2 and the delay manager 310, timing analysis unit 320, and delay adjustment unit 330 in FIG. 3 may be implemented using any known circuitry or technique. It should also be appreciated that not all the components shown in FIGS. 2 and 3 may be required to practice the present invention.

Figure 4:
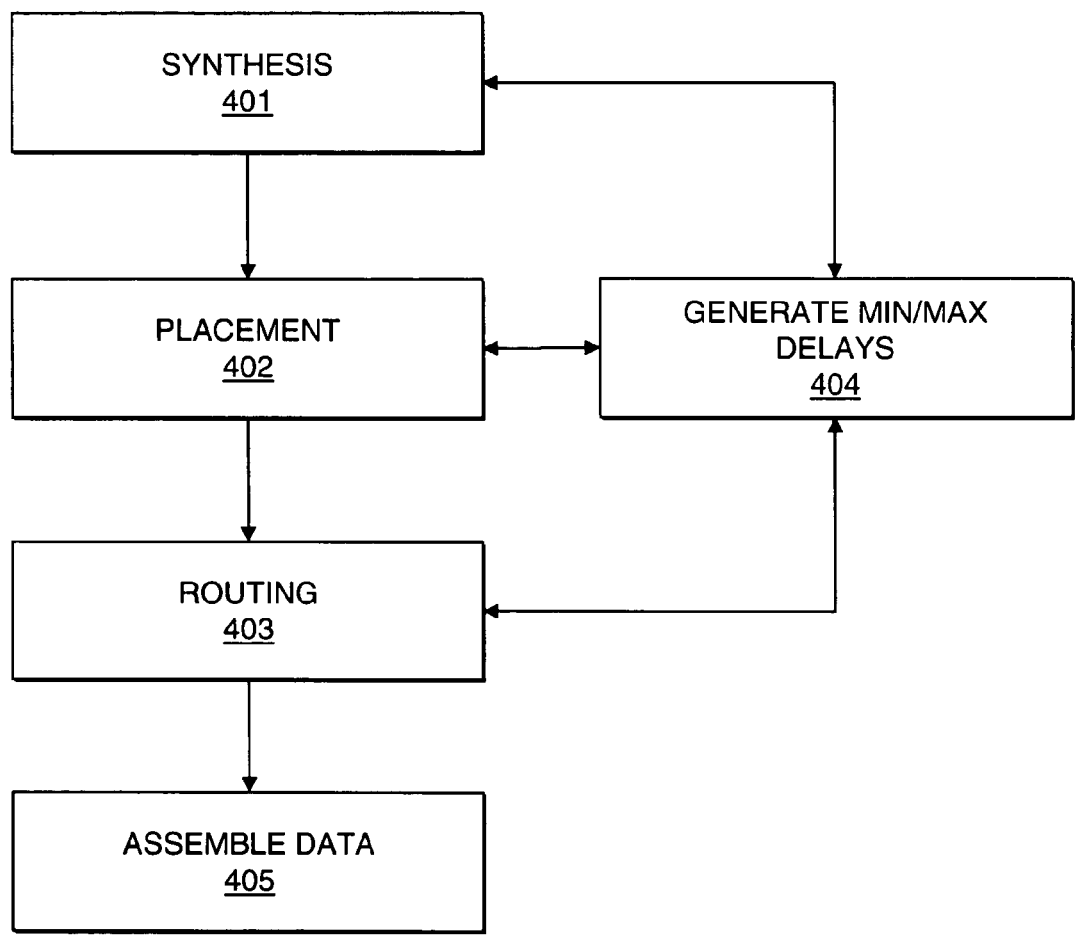
FIG. 4 is a flow chart illustrating a method for designing a system on an FPGA according to an embodiment of the present invention.

FIG. 4 is a flow chart illustrating a method for designing a system on an FPGA according to an embodiment of the present invention. At 401, the system is synthesized. Synthesis includes generating a logic design of the system to be implemented by a target device. According to an embodiment of the present invention, synthesis generates an optimized logical representation of the system from a HDL design definition. Synthesis also includes mapping the optimized logic design. Mapping includes determining how to implement logic components such as logic gates in the optimized logical representation with specific resources on the target device. According to an embodiment of the present invention, a netlist is generated from mapping. This netlist may be an optimized technology-mapped netlist generated from the HDL.

At 402, the mapped logical system design is placed. Placement works on the optimized technology-mapped netlist to produce a placement for each of the logic components. According to an embodiment of the present invention, placement includes fitting the system on the target device by determining which resources on the target device to use for the logic components.

At 403, it is determined which routing resources should be used to connect components such as functional blocks and registers in the system. According to an embodiment of the present invention, routing may be performed in response to routing constraints provided.

At 404, minimum and maximum delay budgets are generated for each connection in the system. According to an embodiment of the present invention, minimum and maximum delay budgets are generated in response to data received by any one of the synthesis, placement, and routing procedures 401, 402, and 403. The minimum and maximum delay budgets are returned to the procedure and used by the procedure to generate a solution. It should be appreciated that minimum and maximum delay budgets may be generated for one or more of the mapping, placement, and routing procedures 401, 402, and 403 in response to data received by the procedure. According to one embodiment, generating minimum and maximum delay budgets involves, first, allocating delay in order to find a set of delays that satisfy long-path and short-path timing constraints and, second, allocating long-path and short-path slack to determine the delay budgets. These procedures will be further described with reference to FIGS. 5 and 6.

At 405, an assembly procedure is performed. The assembly procedure involves creating a data file that includes information determined by the fitting procedure described by 401-404. The data file may be a bit stream that may be used to program the target device.

Figure 5:
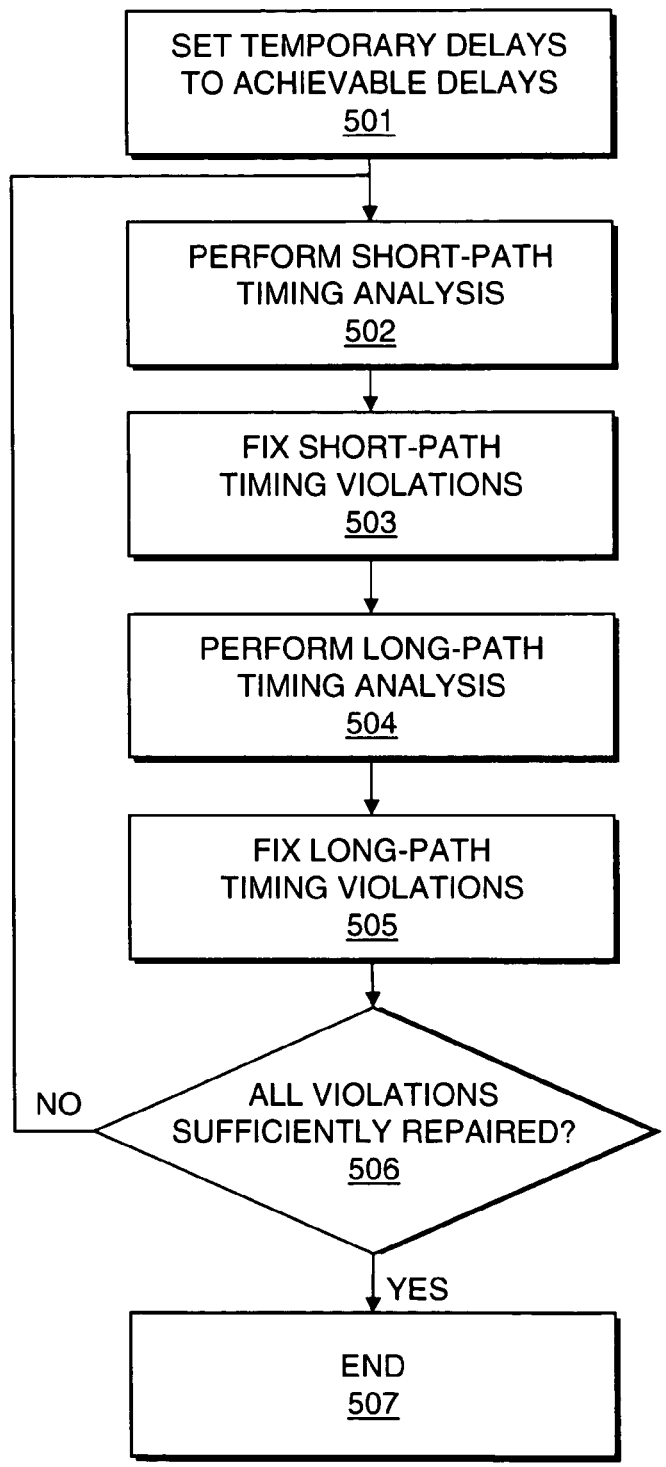
FIG. 5 is a flow chart illustrating a method for distributing delay in order to satisfy long-path and short-path timing constraints according to an embodiment of the present invention.

FIG. 5 is a flow chart illustrating a method for allocating delay in order to satisfy long-path and short-path timing constraints. According to an embodiment of the present invention, allocating delay involves augmenting temporary delays for the connections between functional blocks and registers to meet long-path and short-path timing constraints. Allocating delay may be performed to generate a starting point (set of delays) for the slack allocation iterations (second procedure) that are used to compute the minimum and maximum delay budgets. The slack allocation procedure tries to achieve minimum and maximum delay budgets that are wide apart (and within realistic delay limits). This gives the synthesis/placement/routing tool the most flexibility. The procedure of allocating delay provides the procedure of slack allocation with a good starting point, so that it may have greater potential to achieve a "superior" solution more quickly. At 501, temporary delays for routing the connections between functional blocks and registers are set to achievable delays for routing the connections between functional blocks and registers. According to an embodiment of the present invention, achievable delays are determined by one of the synthesis, placement, or routing procedures 401, 402, or 403 (shown in FIG. 4). The achievable delays may be initial estimates of final delays in the FPGA generated with information available at the time. According to one embodiment, achievable delays for connections are set to the lower delay limits for the connections (based on estimated routes ignoring congestion, but minimizing delay).

At 502, short-path timing analysis is performed. According to an embodiment of the present invention, short-path slack values are generated for each connection. A positive short-path slack value represents how much delay can be subtracted from a connection provided all other connections stay the same before a worst-case path running through it is on the verge of failing its short-path timing constraint. A negative short-path slack value indicates how much delay must be added to a connection, provided all other connections stay the same before the worst case path meets its short-path timing constraint. A negative short-path slack value indicates a short-path timing constraint violation.

To determine a short-path slack value for a connection, for each path through the connection, a cumulative delay for the path is computed. This may be computed by summing the temporary delays associated with the connections on the path. The short-path timing constraint for the path is subtracted from the cumulative delay of the path to determine a path slack value. The smallest path slack value is the short-path slack value for the connection. It should be appreciated that short-path slack values may be computed by performing other techniques. For example, well-known netlist traversal techniques exist to compute the short-path slack values in time proportional to the number of connections in the netlist. At 503, short-path timing constraint violations are fixed. According to an embodiment of the present invention, short-path timing constraints are fixed by adding delay to temporary delays based on (negative) short-path slack values from short-path timing analysis and connection weightings. Positive short-path slack values indicate the timing constraint is already met and those connections do not need fixing. For example, the delay added to a temporary delay associated with a connection may be the absolute value of the negative short-path slack value of the connection multiplied by the weight of the connection divided by the weight of the largest weight path (or a larger number, if estimates are used) passing through the connection. The weight of a connection may be determined using various techniques such as unit weighting, weighting proportional to the delay that can be added to/removed from the connection, and other types of weighting schemes. The weight of a path is determined by summing the individual connection weights along the path. It should be noted that there are many techniques for computing these path weights and assigning the appropriate path weights to connections. Conservative approximations (that may give weights larger than the largest weight path passing through the connection) can be efficiently computed using well-known netlist traversal techniques that operate in time proportional to the number of connections in the netlist. It is important if estimates are used for the denominator that the estimates are larger than the correct values so (negative) slack will not be over-allocated. Overshooting the target (by over-allocating) increases the chance of introducing an unnecessary violation. It should be appreciated that the amount of delay added to the temporary delay may be adjusted to ensure that the adjusted temporary delay remains within its lower and upper delay limits.

At 504, long-path timing analysis is performed. According to an embodiment of the present invention, long-path slack values are generated for each connection. A positive long-path slack value represents how much delay can be added to a connection, provided all other connections stay the same, before a worst-case path running through it is about to fail its long-path timing constraint. A negative long-path slack value indicates how much delay must be subtracted from a connection, provided all other connections stay the same, before the worst case path just meets its long-path timing constraint. A negative long-path slack value indicates a long-path timing constraint violation.

To determine a long-path slack value for a connection, for each path through the connection, a cumulative delay for the path is computed. This may be computed by summing the temporary delays associated with the connections on the path. The cumulative delay for the path is subtracted from the long-path timing constraint of the path to determine a path slack value. The smallest path slack value is the slack value for the connection. It should be appreciated that long-path slack values may be computed by performing other techniques. For example, well-known netlist traversal techniques exist to compute the long-path slack values in time proportional to the number of connections in the netlist.

At 505, long-path timing constraint violations are fixed. According to an embodiment of the present invention, long-path timing constraints are fixed by removing delay from temporary delays based on (negative) long-path slack values from long-path timing analysis and connection weightings. For example, the delay subtracted from a temporary delay associated with a connection may be the magnitude of the negative long-path slack value of the connection multiplied by the weight of the connection divided by the weight of the largest weight path through the connection. The weight of a connection and the path weights may be determined using the various techniques described above, for example. It should be appreciated that the amount of delay subtracted from the temporary delay may be adjusted to ensure that the adjusted temporary delay remains within its lower and upper delay limits.

At 506, it is determined whether all short-path and long-path violations are sufficiently repaired. If all short-path and long-path violations are sufficiently repaired, control terminates the process as shown in 507. If not all short-path and long-path violations are sufficiently repaired, control returns to 502. It should be appreciated that instead of determining whether all violations are sufficiently repaired, 506 may determine whether an N number of iterations of 502-505 have been performed before terminating the process.

Figure 6:
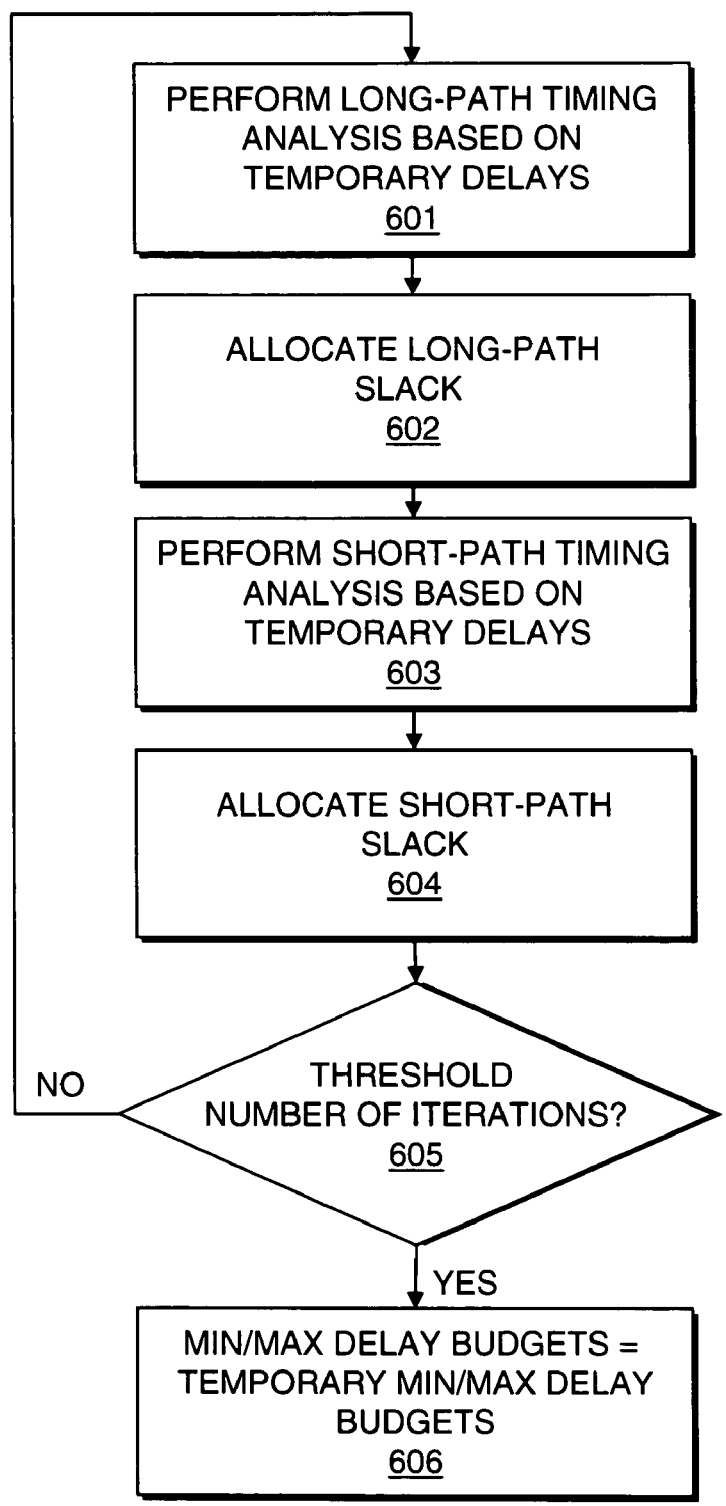
FIG. 6 is a flow chart illustrating a method for allocating long-path and short-path slack according to an embodiment of the present invention.

FIG. 6 is a flow chart illustrating a method for allocating long-path and short-path slack according to an embodiment of the present invention. At 601, long-path timing analysis is performed based on temporary delays. According to an embodiment of the present invention, the temporary delays may be initially generated by performing the procedure described in FIG. 5. Other embodiments may use achievable delay estimates produced by the synthesis/placement/routing tool. Long-path slack values are generated for each connection. The long-path slack values may be generated using the technique described with reference to 504 shown in FIG. 5.

At 602, positive long-path slack values are allocated. Connections with positive slack lie on paths that are all meeting their timing. Long-path slack values may be allocated by adding delay to temporary delays based on long-path slack values and connection weightings. According to an embodiment of the present invention, long-path slack values may be allocated by adding a positive long-path slack value of a connection multiplied by its connection weighting, divided by the weight of the largest weight path through the connection, to a temporary delay associated with the connection. This sum then becomes the new temporary maximum delay budget and the new temporary delay. The weight of a connection and the path weights may be determined using the various techniques described above, for example. It should be appreciated that the amount of slack allocated may be adjusted to ensure that the adjusted temporary delay remains within its lower and upper delay limits.

At 603, short-path timing analysis is performed based on the temporary delays from 602. Short-path slack values are generated for each connection. The short-path slack values may be generated using the technique described with reference to 502 shown in FIG. 5.

At 604, positive short-path slack values are allocated. Connections with positive slack lie on paths that are all meeting their timing. Short-path slack values may be allocated by subtracting delays from temporary delays based on short-path slack values and connection weightings. According to an embodiment of the present invention, short-path slack values may be allocated by subtracting a positive short-path slack value of a connection multiplied by its connection weighting, divided by the weight of the largest weight path through the connection, from a temporary delay associated with the connection. The result of the subtraction is becomes the new temporary minimum delay budget and the new temporary delay. It should be appreciated that the amount of slack allocated may be adjusted to ensure that the adjusted temporary delay remain within its lower and upper delay limits.

At 605, it is determined whether M number of iterations of 601-604 have been performed. If M number of iterations have been performed, control proceeds to 606. If M number of iterations have not been performed, control returns to 601. It should be appreciated that any number may be designated for M. According to an embodiment of the present invention, a number of M is designated that allows for a sufficient number of iterations to be performed to increase the distance between minimum and maximum delay budgets (delay budget windows) for all connections. Large delay budget windows (within legal lower/upper delay limits) are favorable to increase the flexibility offered to synthesis/placement/routing tools. Since the minimum/maximum delay budgets become constraints that the tools need to respect to satisfy timing, looser constraints (larger windows) are favorable.

At 606, the temporary maximum and minimum delay budgets for the connections are designated as the maximum and minimum delay budgets for the connections.

It should be appreciated that successive over-relaxation may be used to speed convergence when assigning slack. According to an embodiment of the present invention, successive over-relaxation over allocates slack. Modifications may be made to compensate for the over-allocation by allowing for slack removal if necessary.

Figure 7:
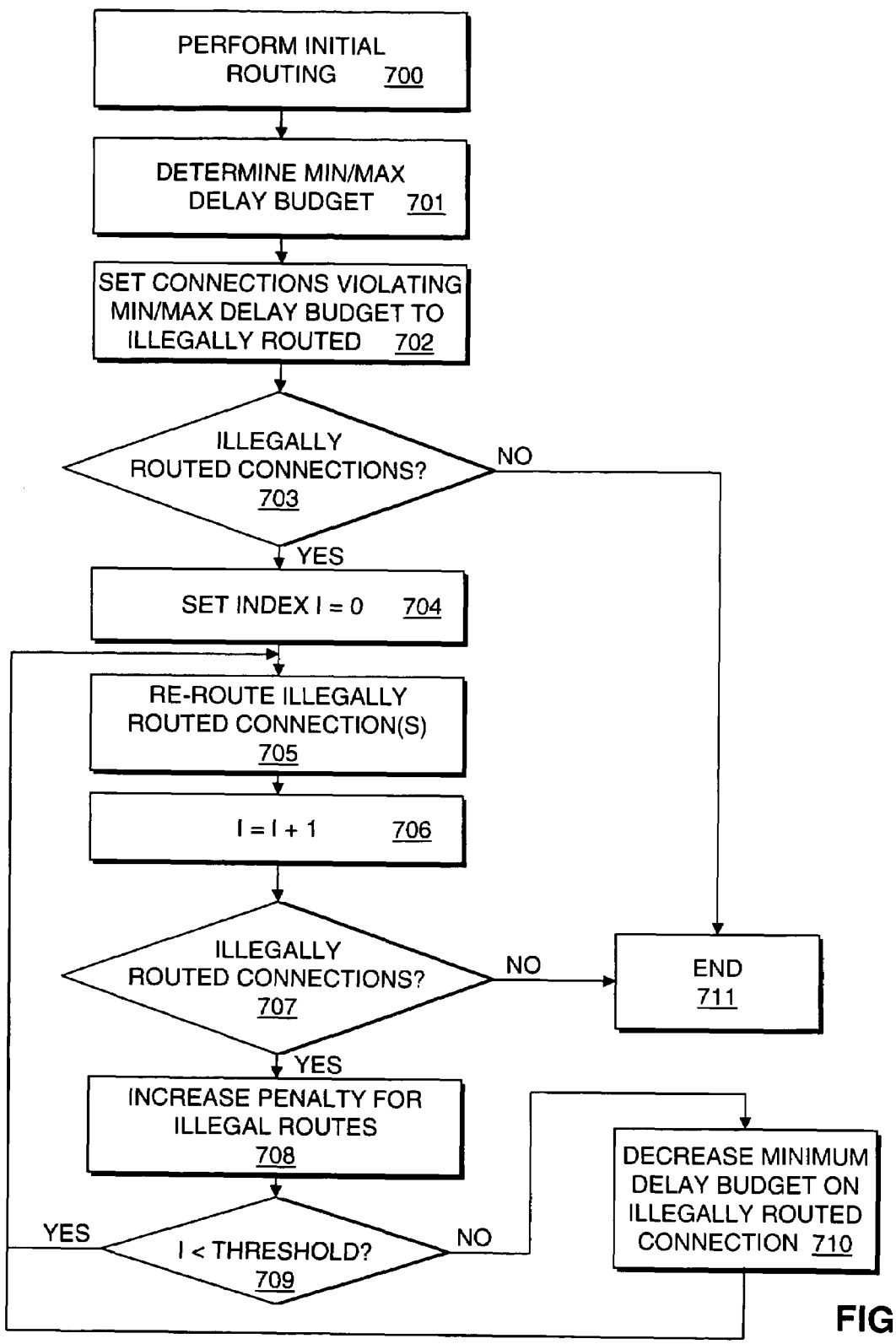
FIG. 7 is a flow chart illustrating a method for routing using long-path and short-path timing constraints according to an embodiment of the present invention.

FIG. 7 is a flow chart illustrating a method for routing using long-path and short-path timing constraints according to an embodiment of the present invention. The method shown may be used to implement procedure 403 and 404 shown in FIG. 4. At 700, an initial routing is performed on the connections of the FPGA. According to one embodiment, a set of routing resources are selected to route from sources of the connections to sinks of the connections. Initially, the routing resources may be selected to minimize the connection delays. Connections driven by the same source can share the same routing resources since they carry the same signals. Connections driven by different sources that share the same routing resources are determined to be illegally routed or "shorted" together. From the initial routing, achievable delays for the connections are generated (and these delays are also used as lower delay limits).

According to an embodiment of the present invention, the routing algorithm uses a heap (to guide a directed search) and a look-ahead (to estimate delays) to route a connection with minimal delay. Starting at the source of a connection, the routing procedure searches through the routing fabric towards the destination along routing resources that it thinks are promising. The routing procedure uses a heap to determine which is the most promising routing resource to explore next. The cost used to "score" routing resources on the heap may be dependent on criteria including the delay from the source to the routing resource, the delay of the routing resource, the estimated delay from the routing resource to the sink (estimated using what is called the look-ahead), and a penalty for using a routing resource that has already been selected for another connection driven by a different source. Starting at the source, the router inserts the routing resources reachable from the source on the heap (with their appropriate scores). The router then removes the "most promising" routing resource from the heap, in turn, inserting the resources reachable from this "most promising" routing resource (with their appropriate scores). After repeating this process, eventually the destination will be removed from the heap and routing of the connection will be complete. The router keeps track of which resources were reached from which resources, so when the destination is removed from the heap, the router is able to trace back and figure out all the routing resources used to route the connection.

At 701, minimum and maximum delay budgets are generated for the connections. The minimum and maximum delay budgets may be determined from the achievable delays determined for each connection from 701, lower delay limits set by the achieved delays, upper delay limits that may be based on the routing resources available between functional blocks, and long-path and short-path timing constraints. According to an embodiment of the present invention, minimum and maximum delay budgets may be determined using the procedures described in FIGS. 5 and 6.

At 702, all connections having a delay outside the minimum and maximum delay budgets are designated as being illegally routed.

At 703, it is determined whether any illegally routed connections exist. According to an embodiment of the present invention, a shorted connection may be considered an illegally routed connection. If illegally routed connections exist, control proceeds to 704. If illegally routed connections do not exist, control proceeds to 711.

At 704, an index I is set to 0.

At 705, illegally routed connections are re-routed. According to an embodiment of the present invention, a set of routing resources is selected for each connection that was illegally routed to try to avoid using routing resources that have been selected to route differently sourced connections (based on the cost function described above). The set of routing resources are also selected to keep the total connection delay within its minimum and maximum delay budget. According to an embodiment of the present invention, the minimum and maximum delay budgets are utilized to converge on a solution that satisfies long-path and short-path timing constraint. For example, delay may be added to a connection by using extra wiring or slower delay chains on connections with large minimum delay budgets. Delay may also be reduced by avoiding routing resources that would slow down connections to a point where the maximum delay budget would be violated. The look-ahead and heap (of a minimum delay router) described in 701 may be used to re-route the illegally routed connections. The heap may be adjusted, in this embodiment, by changing the scoring of a routing resource to cost not the expected connection delay if the routing resource is used, but the amount the expected connection delay is going to violate the delay budgets. The look-ahead, in this embodiment, may be adjusted to understand the delay budget target, so it estimates a delay that the router can achieve given that it is trying to hit the minimum/maximum delay budget. Adjusting the look-ahead is important so that the heap properly evaluates competing routing resources. For example, if the look-ahead over-estimates delay, the router will use short/faster routes at the beginning of a path thinking that the future (look-ahead predicted) delay will be large. However, it will end up needing to use slow/longer routes at the end of the path to make up for this which may be unfavorable if the resources do not exist at the destination to slow down the connection.

At 706, index I is incremented by 1.

At 707, it is determined whether any illegally routed connections exist. According to an embodiment of the present invention, a shorted connection may be considered an illegally routed connection. If illegally routed connections exist, control proceeds to 708. If illegally routed connections do not exist, control proceeds to 711.

At 708, a penalty for illegal routing is increased. According to an embodiment of the present invention, the cost function described in 701 and 705 and used in 701 and 705 is adjusted to reflect the increase in penalty.

At 709, it is determined whether index I is less than a threshold value. If index I is less than a threshold value, control returns to 705. If index I is greater than the threshold value, control proceeds to 710.

At 710, the minimum delay budget is decreased on illegally routed connections. Control proceeds to 705.

At 711, control terminates the procedure.

It should be appreciated that at 703 and 707, routing resources selected for a connection may also be checked to determine whether they meet the minimum and maximum delay budget for the connection. In this embodiment, connections not meeting the minimum and maximum delay budgets may be re-routed.

FIGS. 4-7 are flow charts illustrating methods according to embodiments of the present invention. The techniques illustrated in these figures may be performed sequentially, in parallel or in an order other than that which is described. It should be appreciated that not all of the techniques described are required to be performed, that additional techniques may be added, and that some of the illustrated techniques may be substituted with other techniques.

Figure 8A:
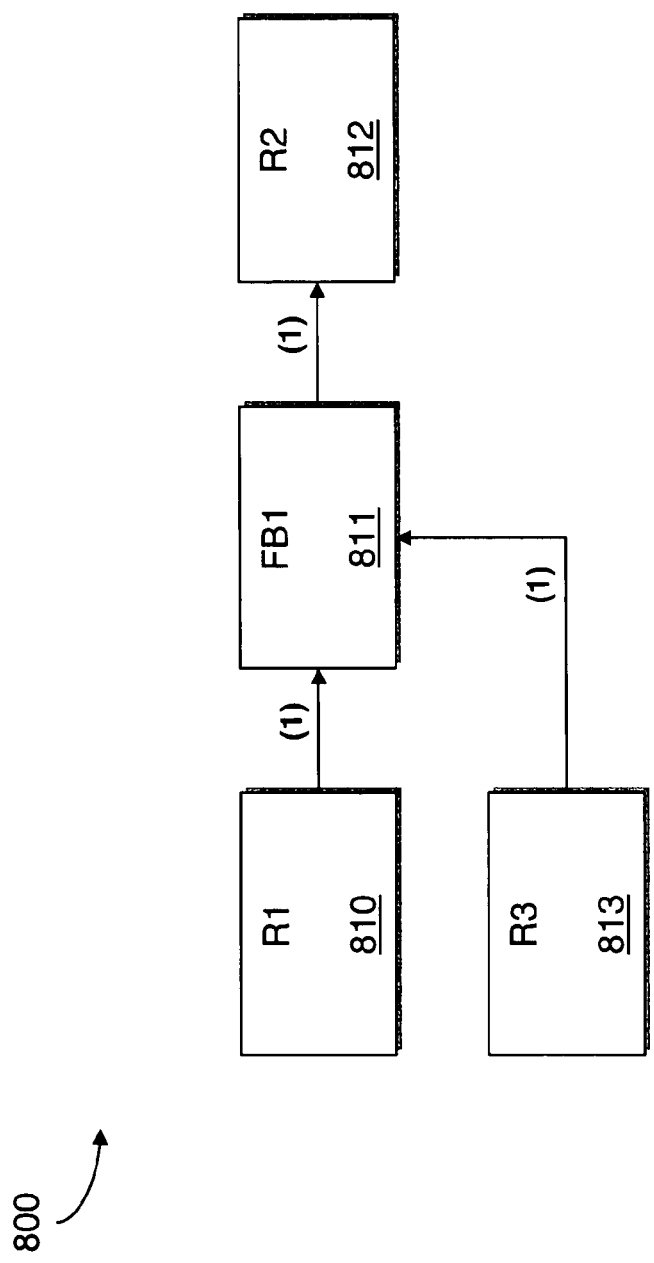

FIGS. 8*a-k* illustrate an example of determining minimum and maximum delay budgets for connections in an FPGA. Referring to FIG. 8*a*, minimum and maximum delay budgets are determined for connections attaching functional block and registers 810-813 in circuit 800. In this example, one path passes from register R1 810, to functional block FB1 811, to register R2 812. A second path passes from register R3 813, to functional block FB 811, to register R2 812. A long-path timing constraint of 10 ns is specified for the path from R1 810 to R2 812 and a long-path timing constraint of 20 ns is specified for the path from R3 813 to R2 812. A short-path timing constraint of 5 ns is specified for the path from R1 810 to R2 812 and a short-path timing constraint of 2 ns is specified for the path from R3 813 to R2 812.

With reference to FIG. 5, delay is allocated in order to satisfy long-path and short-path timing constraints. At 501, temporary delays for routing the connections between functional blocks and registers are set to achievable delays for routing the connections between functional blocks and registers. In this example, achievable delays are determined to be 1 ns between each of the connections between R1 810 and FB1 811, FB1 811 and R2 812, and R3 813 and FB1 811. These are shown in parenthesis. The lower delay limit for each of the connections is set to the achievable delays for the connections. The upper delay limit for each of the connections is set to 100 ns.

Figure 8B:
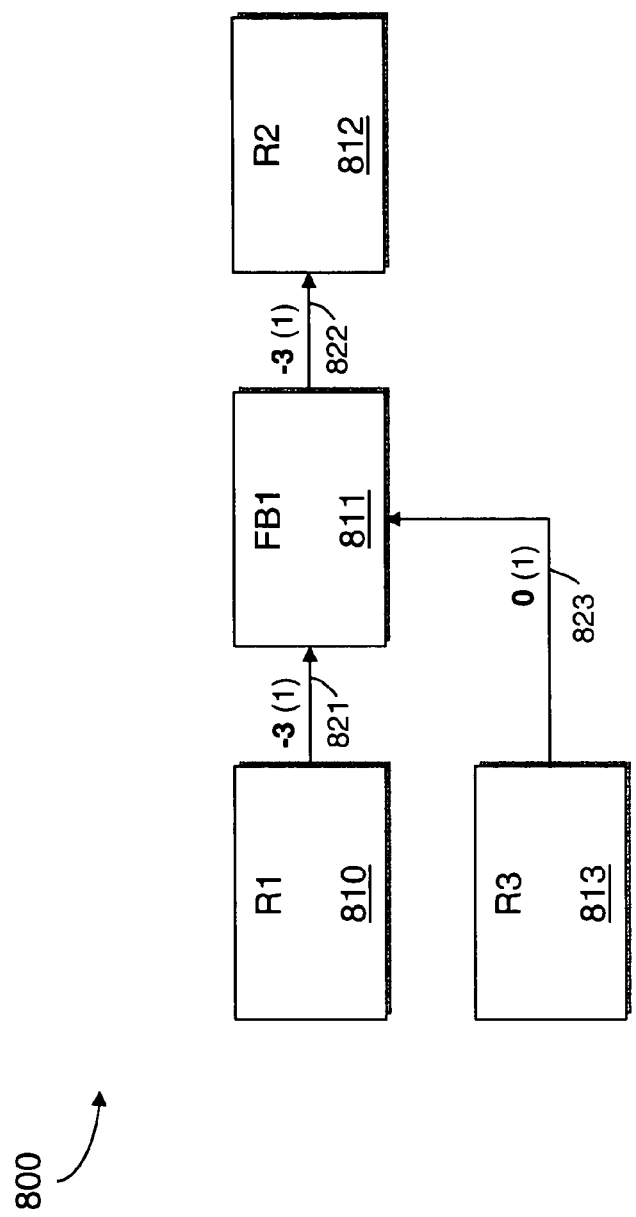

At 502, short-path timing analysis is performed as shown in FIG. 8b. To determine a short-path slack value for a connection, for each path through the connection, a cumulative delay for the path is computed. This may be computed by summing the temporary delays associated with the connections on the path. For path 1 through R1 810, FB1 811, and R2 812, the cumulative delay is 2 ns. The short-path timing constraint for the path, 5 ns, is subtracted from the cumulative delay, 2 ns, to determine a path slack value −3 ns. For path 2 through R3 813, FB1 811, and R2 812, the cumulative delay is 2 ns. This short-path timing constraint for the path, 2 ns, is subtracted from the cumulative delay, 2 ns, to determine a path slack value 0. The path slack value having the lowest value is the short-path slack value for the connection. For the connection 821 between R1 810 and FB1 811, the short-path slack value is −3 ns. For the connection 822 between FB1 811 and R2 812, the short-path slack value is −3 ns. For the connection 823 between R3 813 and FB1 811, the short-path slack value is 0. Connections 821 and 822 have short-path timing constraint violations.

Figure 8C:
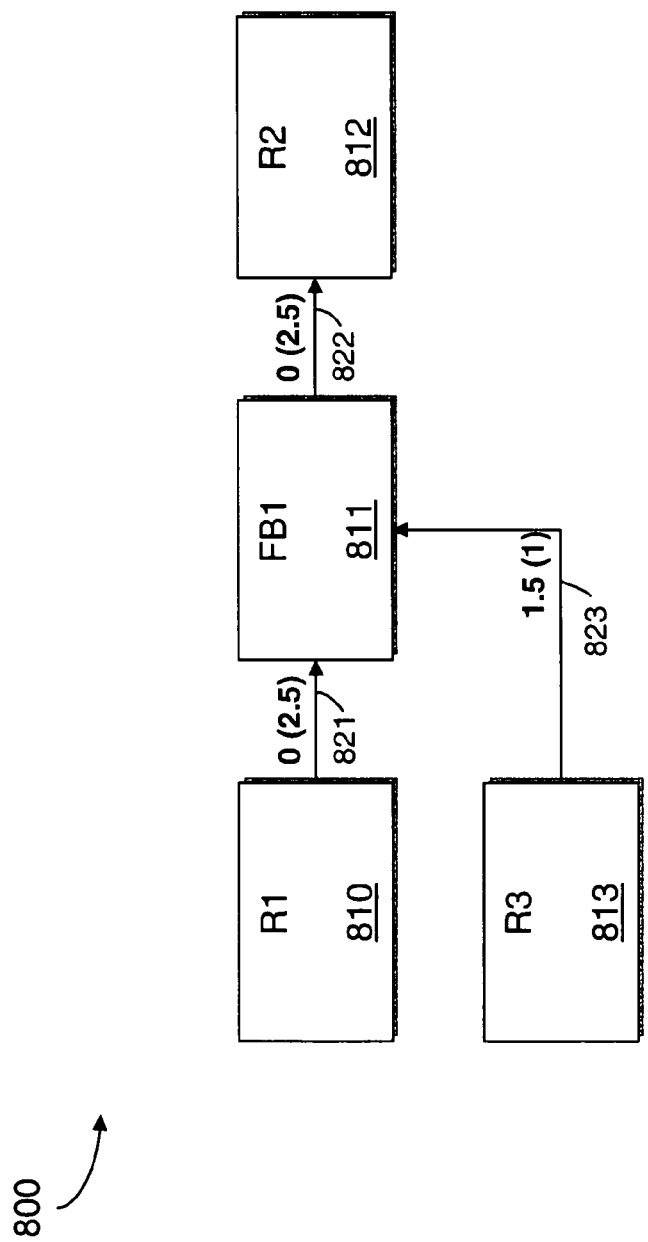

At 503, short-path timing constraint violations are fixed as shown in FIG. 8c. According to an embodiment of the present invention, short-path timing constraints are fixed by adding delay to temporary delays based on short-path slack values from short-path timing analysis and connection weightings. The delay added to the temporary delay associated with connection 821 is the magnitude of the negative short-path slack value of the connection 821, 3 ns, multiplied by the weight of the connection, 1, divided by the largest path weight of all paths passing through the connection, 2. Notice by using the largest path weight of all paths passing through the connection in the denominator, (negative) slack will never be over-allocated. A larger number in the denominator may be used if the number needs to be approximated. Convergence may be hindered but it is important that (negative) slack not be over-allocated or the algorithm will diverge. The new temporary delay is 2.5 ns. The weight of a connection is determined throughout this example using unit weighting. The delay added to the temporary delay associated with connection 822 is the negative short-path slack value of the connection 821, 3 ns, multiplied by the weight of the connection, 1, divided by the largest path weight of all paths passing through the connection, 2. The new temporary delay is 2.5 ns.

Figure 8D:
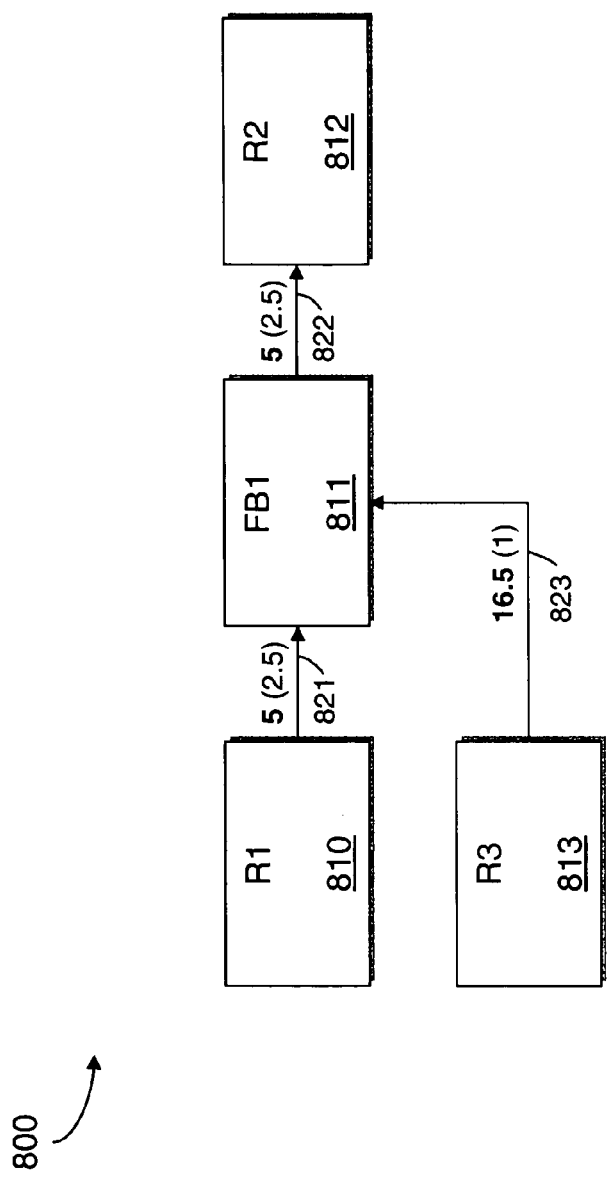

At 504, long-path timing analysis is performed as shown in FIG. 8d. To determine a long-path slack value for a connection, for each path through the connection, a cumulative delay for the path is computed. This may be computed by summing the temporary delays associated with the connections on the path. For path 1 through R1 810, FB1 811, and R2 812, the cumulative delay is 5 ns. This cumulative delay, 5 ns, is subtracted from the long-path timing constraint for the path, 10 ns, to determine a path slack value 5 ns. For path 2 through R3 813, FB1 811, and R2 812, the cumulative delay is 3.5 ns. This cumulative delay, 3.5 ns, is subtracted from the long-path timing constraint for the path, 20 ns, to determine a path slack value 16.5 ns. The path slack value having the lowest value is the long-path slack value for the connection. For connection 821, the long-path slack value is 5 ns. For connection 822, the long-path slack value is 5 ns. For connection 823, the long-path slack value is 16.5 ns. Since all long-path slack values are positive, there are no long-path timing constraint violations.

At 505, long-path timing constraint violations are fixed. Since no long-path timing constraints exist, control proceeds to 506.

At 506, it is determined that all short-path and long-path violations are sufficiently repaired and that delay has been sufficiently allocated to satisfy both long-path and short-path timing constraints. That is, the achievable (initial) delays were adjusted minimally to find a set of delays that meet the timing requirements—to prepare for the next phase of the algorithm.

With reference to FIG. 6, long-path and short-path slack values are allocated in order to determine minimum and maximum delay budgets. At 601, long-path timing analysis is performed based on temporary delays that satisfy long-path and short-path timing constraints determined at 506. Long-path slack values are generated for each connection as shown in FIG. 8(d).

At 602, long-path slack values are allocated as shown in FIG. 8(e). Long-path slack values may be allocated by adding delay to temporary delays based on long-path slack values and connection weightings. For connection 821, long-path slack value is allocated by adding a positive long-path slack value of the connection, 5 ns, multiplied by its connection weighting, 1, divided by the largest path weight through the connection, 2, to a temporary delay associated with the connection, 2.5 ns. Notice by using the largest path weight of all paths passing through the connection in the denominator, (positive) slack will never be over-allocated. A larger number in the denominator may be used if the number needs to be approximated. Convergence may be hindered but it is important that (positive) slack not be over-allocated or the algorithm will diverge. The sum, 5 ns, is designated as a temporary maximum delay budget and the adjusted temporary delay for connection 821. For connection 822, long-path slack value is allocated by adding a positive long-path slack value of the connection, 5 ns, multiplied by its connection weighting, 1, divided by the largest path weight through the connection, 2, to a temporary delay associated with the connection, 2.5 ns. The sum, 5 ns, is designated as a temporary maximum delay budget and the adjusted temporary delay for connection 822. For connection 823, long-path slack value is allocated by adding a positive long-path slack value of the connection, 16.5 ns, multiplied by its connection weighting, 1, divided by the largest path weight through the connection, 2, to a temporary delay associated with the connection, 1 ns. The sum, 9.25 ns, is designated as a temporary maximum delay budget and the adjusted temporary delay for connection 823.

Figure 8F:
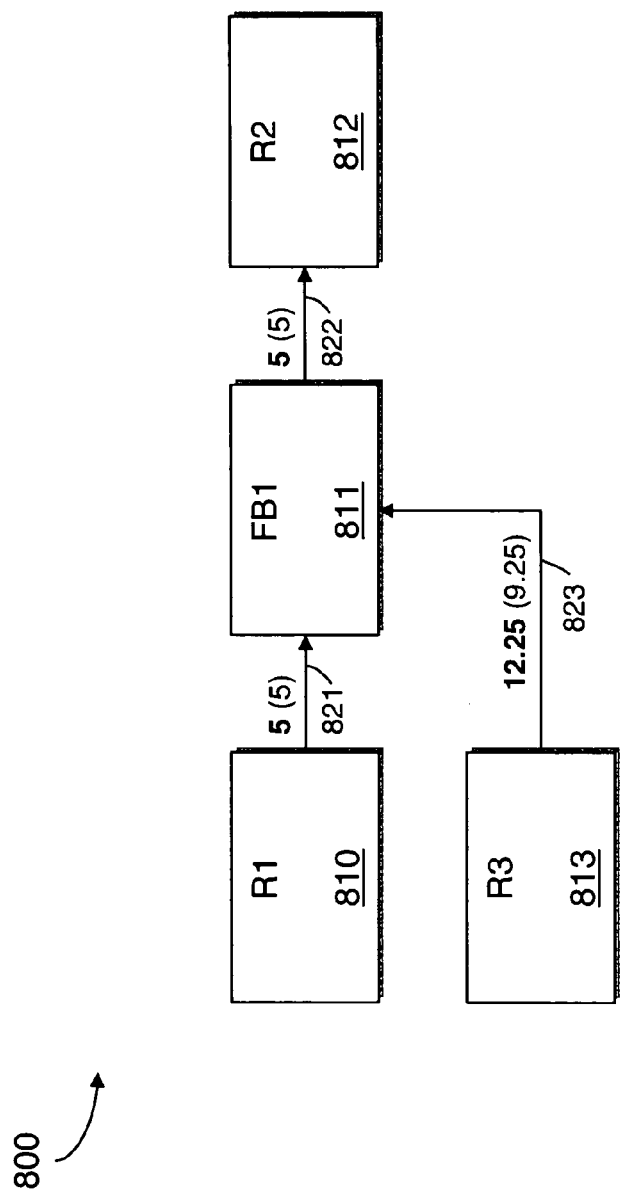

At 603, short-path timing analysis is performed based on the temporary delays from 602 as shown in FIG. 8(f). Short-path slack values 5 ns, 5 ns, and 12.25 ns are generated for connections 821-823 respectively. The short-path slack values may be generated using the technique described with reference to 502 shown in FIG. 5.

Figure 8G:
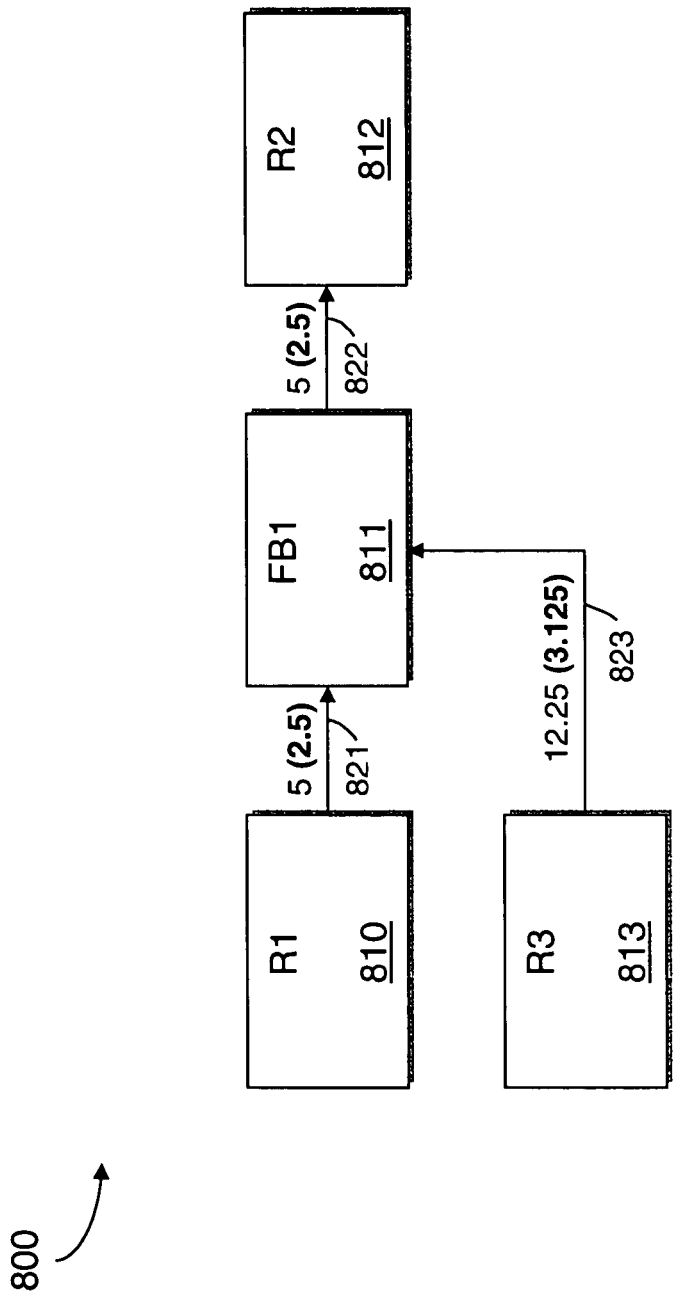
Figure 8H:
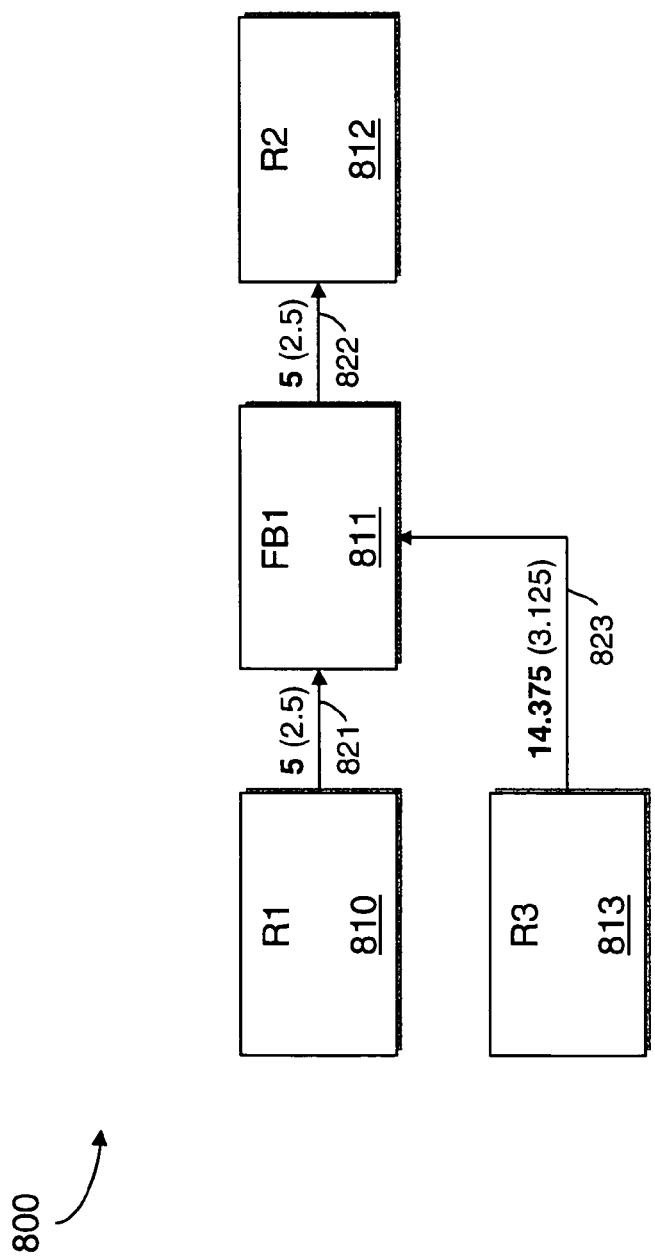
Figure 8I:
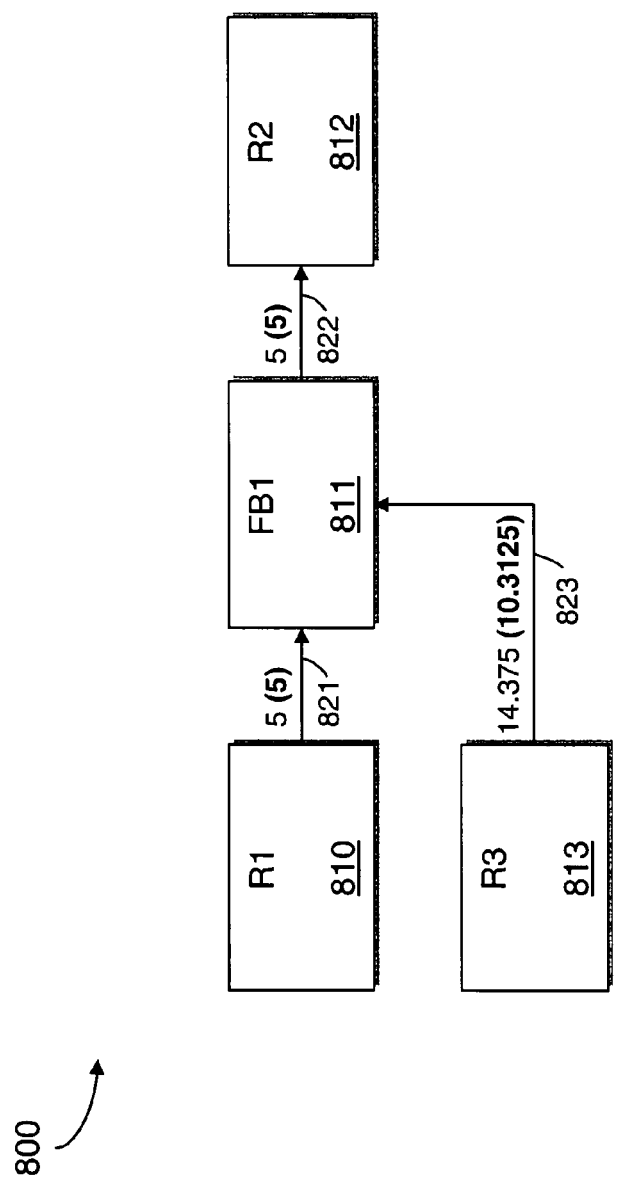
Figure 8J:
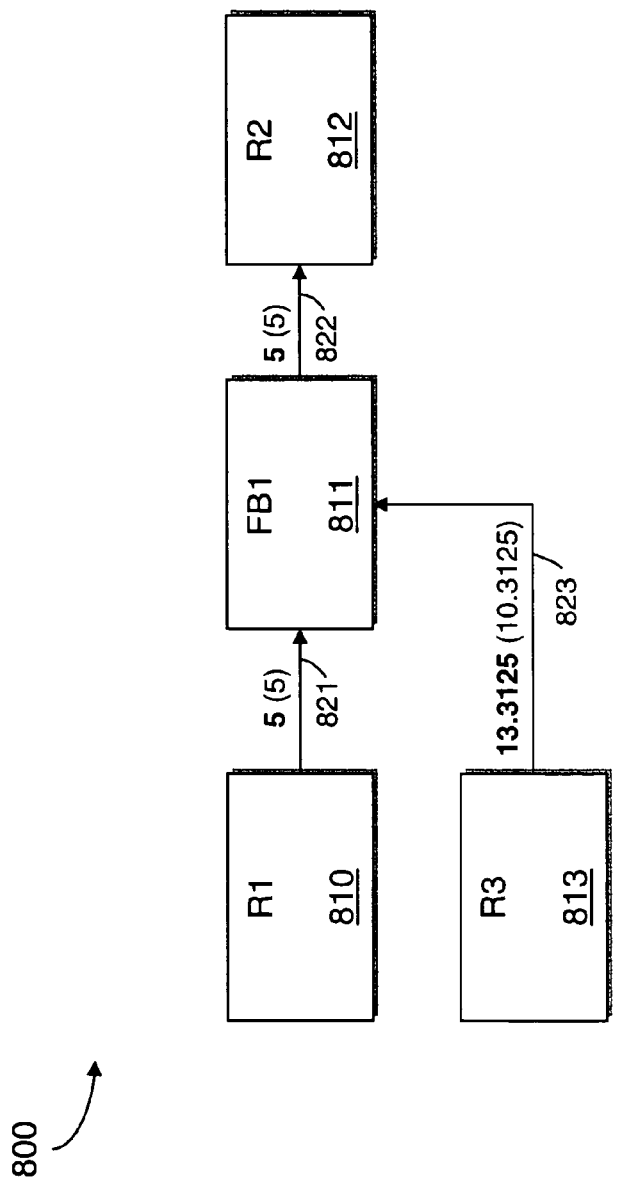

At 604, short-path slack values are allocated as shown in FIG. 8(g). Short-path slack values may be allocated by subtracting delays from temporary delays based on short-path slack values and connection weightings. For connection 821, short-path slack values may be allocated by subtracting a positive short-path slack value of the connection, 5 ns, multiplied by its connection weighting, 1, divided by the maximum path weight of all paths through the connection, 2, from a temporary delay associated with the connection, 5 ns. The difference, 2.5 ns, is designated as a temporary minimum delay budget and the adjusted temporary delay for connection 821. For connection 822, short-path slack values may be allocated by subtracting a positive short-path slack value of the connection, 5 ns, multiplied by its connection weighting, 1, divided by the maximum path weight of all paths through the connection, 2, from a temporary delay associated with the connection, 5 ns. The difference, 2.5 ns, is designated as a temporary minimum delay budget and the adjusted temporary delay for connection 822. For connection 823, short-path slack values may be allocated by subtracting a positive short-path slack value of the connection, 12.25 ns, multiplied by its connection weighting, 1, divided by the maximum path weight of all paths through the connection, 2, from a temporary delay associated with the connection, 9.25 ns. The difference, 3.125 ns, is designated as a temporary minimum delay budget and the adjusted temporary delay for connection 823.

At 605, it is determined whether M number of iterations of 601-604 have been performed. In this example, M equals 2 and control returns to 601. It should be noted that these iterations are attempting to maximize the delay budget window sizes.

At 601, long-path timing analysis is performed based on the current temporary delays, from 605. Long-path slack values are generated for each connection as shown in FIG. 8(*h*). The long-path slack values 5 ns, 5 ns, and 14.375 ns are generated for connections 821-823 respectively.

At 602, long-path slack values are allocated as shown in FIG. 8(*i*). For connection 821, long-path slack value is allocated by adding a positive long-path slack value of the connection, 5 ns, multiplied by its connection weighting, 1, divided by the largest path weight of all paths through the connection, 2, to a temporary delay associated with the connection, 2.5 ns. The sum, 5 ns, is designated as a temporary maximum delay budget and the adjusted temporary delay for connection 821. For connection 822, long-path slack value is allocated by adding a positive long-path slack value of the connection, 5 ns, multiplied by its connection weighting, 1, divided by the largest path weight of all paths through the connection, 2, to a temporary delay associated with the connection, 2.5 ns. The sum, 5 ns, is designated as a temporary maximum delay budget and the adjusted temporary delay for connection 822. For connection 823, long-path slack value is allocated by adding a positive long-path slack value of the connection, 14.375 ns, multiplied by its connection weighting, 1, divided by the largest path weight of all paths through the connection, 2, to a temporary delay associated with the connection, 3.125 ns. The sum, 10.3125 ns, is designated as a temporary maximum delay budget and the adjusted temporary delay for connection 823.

At 603, short-path timing analysis is performed based on the temporary delays from 602 as shown in FIG. 8(*j*). Short-path slack values 5 ns, 5 ns, and 13.3125 ns are generated for connections 821-823 respectively.

At 604, short-path slack values are allocated as shown in FIG. 8(*k*). For connection 821, short-path slack values may be allocated by subtracting a positive short-path slack value of the connection, 5 ns, multiplied by its connection weighting, 1, divided by the largest path weight of all paths through the connection, 2, from a temporary delay associated with the connection, 5 ns. The difference, 2.5 ns, is designated as a temporary minimum delay budget and the adjusted temporary delay for connection 821. For connection 822, short-path slack values may be allocated by subtracting a positive short-path slack value of the connection, 5 ns, multiplied by its connection weighting, 1, divided by the largest path weight of all paths through the connection, 2, from a temporary delay associated with the connection, 5 ns. The difference, 2.5 ns, is designated as a temporary minimum delay budget and the adjusted temporary delay for connection 822. For connection 823, short-path slack values may be allocated by subtracting a positive short-path slack value of the connection, 13.3125 ns, multiplied by its connection weighting, 1, divided by the largest path weight of all paths through the connection, 2, from a temporary delay associated with the connection, 10.3125 ns. The difference, 3.65625 ns, is designated as a temporary minimum delay budget and the adjusted temporary delay for connection 823.

At 605, it is determined that a threshold iteration of 2 has been met.

At 606, the temporary maximum and minimum delay budgets for the connections are designated as the maximum and minimum delay budgets for the connections.

The techniques above have been described with reference to designing a programmable logic device. It should be appreciated that the techniques (for synthesis, placement, routing, etc.) may be used in any EDA tool for the creation/processing/optimization/implementation of any electronic design, such as that encountered in the creation of application specific integrated circuits (ASICs) for example, etc.

Embodiments of the present invention (e.g. exemplary process described with respect to FIGS. 4-7) may be provided as a computer program product, or software, that may include a machine-readable medium having stored thereon instructions. The machine-readable medium may be used to program a computer system or other electronic device. The machine-readable medium may include, but is not limited to, floppy diskettes, optical disks, CD-ROMs, and magneto-optical disks, ROMs, RAMs, EPROMs, EEPROMs, magnetic or optical cards, flash memory, or other type of media/machine-readable medium suitable for storing electronic instructions.

FIGS. 4-7 illustrate a method for designing a system on a PLD according to embodiments of a present invention. Among these embodiments, a method for routing considering long-path and short-path timing constraints is illustrated. It should be appreciated that long-path and short-path timing constraints may be satisfied using other techniques and procedures.

Figure 9:
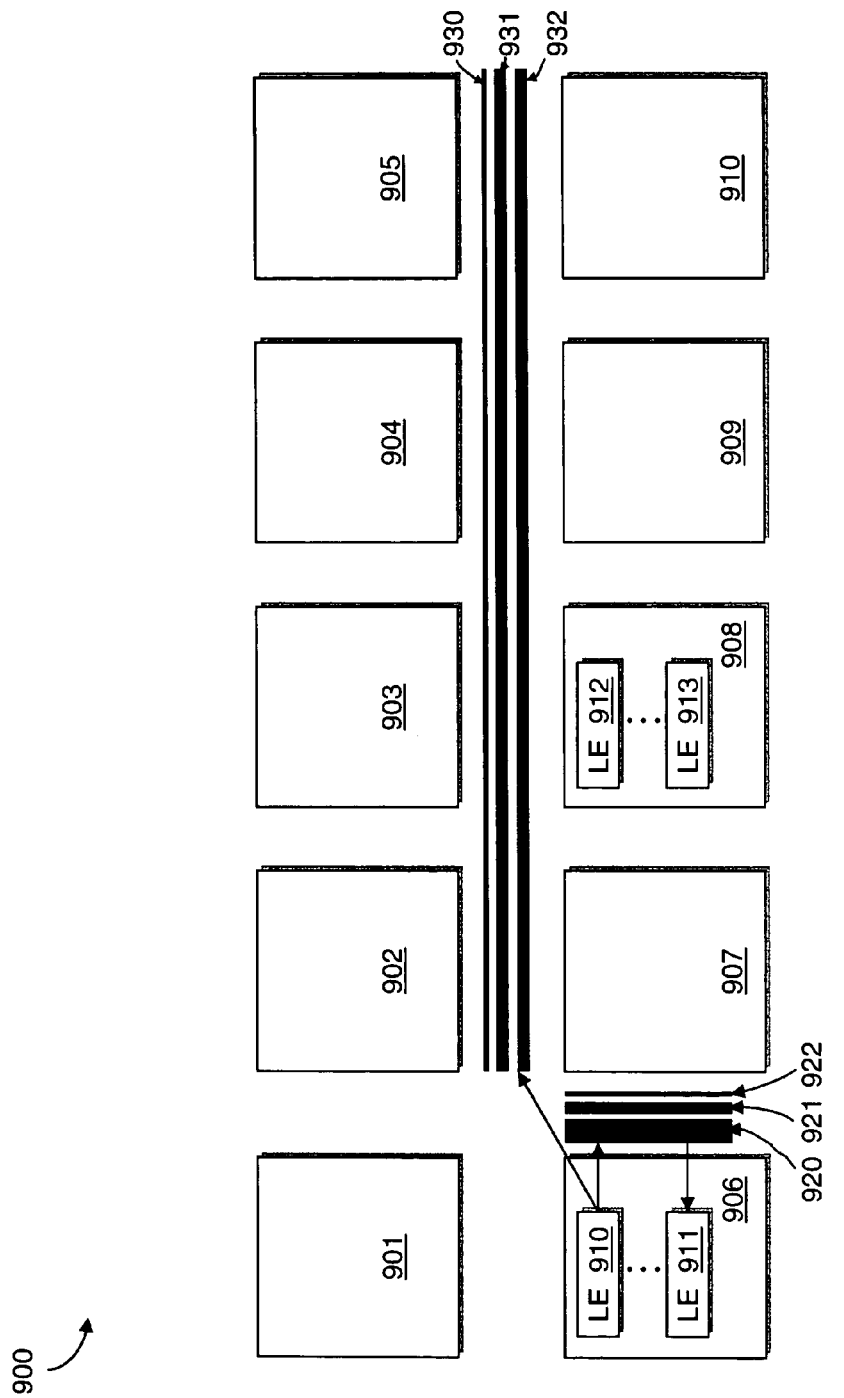
FIG. 9 illustrates an area on an FPGA that includes routing resources of equal length and varying delays according to an embodiment of the present invention.

FIG. 1 illustrates an embodiment of a FPGA 100 according to an embodiment of the present invention. The FPGA 100 may include features to improve the efficiency and effectiveness of short-path timing optimization. FIG. 9 illustrates an area on an FPGA 900 that includes routing resources having differing delays according to an embodiment of the present invention. The FPGA 900 includes a plurality of LABs 901-910. Each LAB includes a plurality of LEs. LAB 906 is shown to include LEs 910-911. LAB 908 is shown to include LEs 912-913. Some of the LABs 901-910 may be utilized to implement some of the LABs shown as 110 and 111 in FIG. 1.

The FPGA 900 includes a plurality of routing resources. The routing resources include local interconnect lines 920-922 and row interconnect lines 930-932. Local interncon-nect lines generally route signals between LEs in a same LAB. Non-local interconnect lines such as row and column interconnect lines route signals between LEs in different LEs. Local interconnect lines 920-922 each span the same distance on the FPGA, but each local interconnect line has a different delay (indicated by differing thickness). Non-local interconnect lines 930-932 each span a same distance on the FPGA, but each non-local interconnect line also has a different delay (also indicated by differing thickness). The local interconnect lines 920-922 and non-local interconnect lines 930-932 may have different geometries/spacings, be made of different materials, be implemented in different process layers, be implemented using different logic structures, and/or have different properties so to generate differing propagation delays. Local interconnect lines 920-922 may be used to implement some of the local interconnect lines shown as 120 and 121 in FIG. 1. Non-local interconnect lines 930-932 may be used to implement some of the non-local interconnect lines shown as 130 in FIG. 1. Although only 2 sets of routing resources are shown in FIG. 2, it should be appreciated that additional sets of routing resources may be implemented between the LABs 901-910. It should also be appreciated that the interconnect lines of differing delay can span the same distances/positions or different distances/positions. If different distances are spanned, the interconnect lines may have different delays per unit of logical length. In this embodiment, faster and slower interconnect lines can be offered. In the past only low-delay interconnection lines were typically offered to address long-path timing optimization.

By offering routing resources, such as wires, having differing delays, short-path timing constraints may be better satisfied. During routing, a router, such as routing unit 230 (shown in FIG. 2), may attempt to select routing resources to achieve a total path delay that is within a certain delay window. The delay window may be computed based on long-path and short-path timing constraints. By including wires of differing delay, the routing unit 230 is given more options to select routing resources that achieve the appropriate delay, while routing to the destination.

Figure 10:
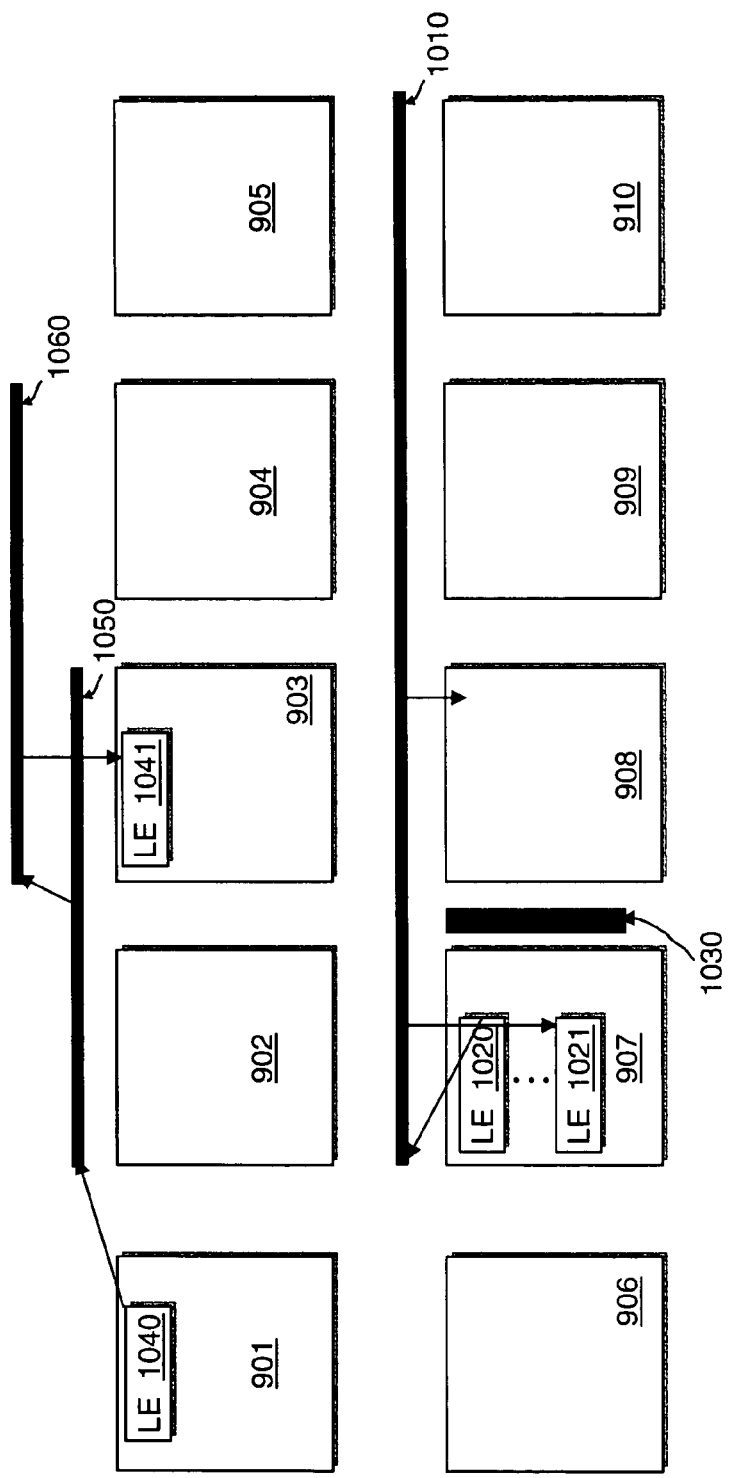
FIG. 10 illustrates an area on an FPGA that includes a non-local interconnect capable of routing signals within a LAB, and an area on an FPGA that includes two non-local interconnect lines capable of routing signals between LABs two units apart, both according to embodiments of the present invention.

FIG. 10 illustrates an area on an FPGA 900 that includes a non-local interconnect line 1010 capable of routing signals from a LAB back to the same LAB according to an embodiment of the present invention. In the past, when routing signals within a LAB (such as from LE 1020 to LE 1021), only local interconnect (such as local interconnect line 1030) were primarily used. Consequently, non-local interconnect routing alternatives for routes from a LAB, and back to the same LAB, were highly inefficient (FIG. 14) because they used a lot of wire. Local interconnects typically have smaller signal propagation delays than non-local interconnects. By allowing LE 1020 to drive non-local interconnect routing resources, such as non-local interconnect line 1010, back into LAB 907 and into LE 1021, a greater delay is incurred for signals transmitted from 1020 to 1021, while the route is kept efficient, so resource waste is not excessive. This can be considered to be an example of delay sub-optimal stitching. Typically, from a long-path timing perspective, there is no advantage having non-local interconnects drive back into the same LAB that can drive them. For long-path timing, it is generally advantageous to drive the maximum distance in the minimum delay, but for short-path timing, this type of sub-optimal stitch is useful. Non-local interconnect line 1010 may be used to implement some of the non-local interconnect lines shown as 130 in FIG. 1.

Another example of non-local interconnect line delay sub-optimal stitches are connections from the mid-point (instead of the end-point) of a first interconnection line to a second interconnect line where both interconnect lines propagate signals in the same direction. This results in overlap between the interconnect lines and, hence, a shorter distance is reached even though two interconnection lines are used (and the corresponding delays are incurred). This may be useful to slow down connection for short-path timing, but is sub-optimal from a delay minimization perspective (long-path timing). FIG. 10 illustrates a first interconnect line 1050 and a second interconnect line 1060 that propagate signals in the same direction. The first and second interconnect lines 1050 and 1060 may be used to route a signal from LE 1040 to LE 1041. In particular, for short-path timing considerations, the router can utilize delay sub-optimal stitching to use a greater number of wires than a minimum number possible while routing directly toward the destination. This avoids the router having to route away from and then back towards the destination to use the needed number of interconnect lines to achieve the desired delay; it is less likely the router can find the needed number of interconnect lines and still reach the destination when such circuitous routes must be employed. This is illustrated with reference to FIG. 14.

Sub-optimal stitching may also be implemented by using local interconnect lines to drive other local interconnect lines in the same LAB. This allows small delay increments to be added to a route because the local interconnect delay is relatively small. From a long-path timing perspective, this technique of stitching between local interconnect lines is not generally useful because no distance is traversed, but added delay is incurred. However, for simultaneous short-path and long-path optimization, adding small increments of delay can be useful. Furthermore, a combination of local interconnect line(s) may be used with non-local interconnect line(s) to provide finer granularity of delay adjustment in a routing fabric. For example, an LE can feed a length-2 non-local interconnect line, which can feed two local interconnect lines before driving the destination LE. The two local interconnect lines are used to slow the respective signal to get a good delay for short-path and long-path timing.

Figure 11:
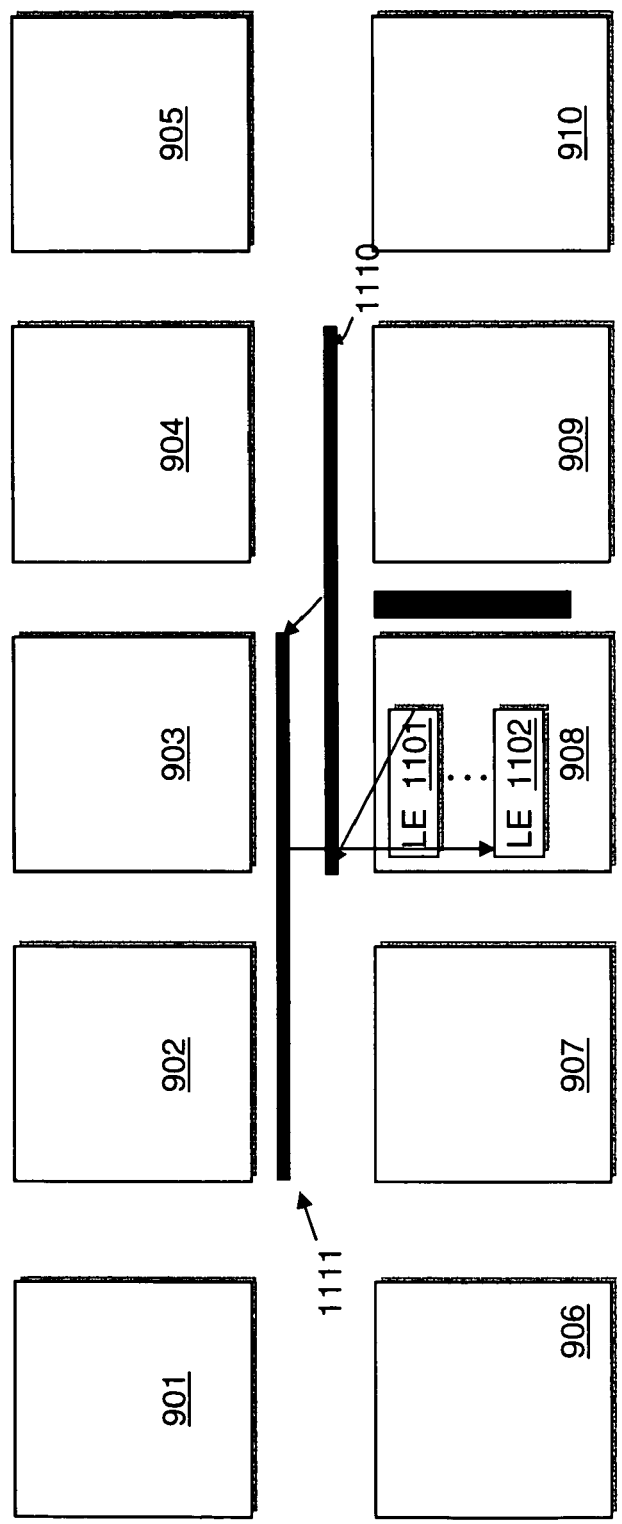
FIG. 11 illustrates an area on an FPGA that includes non-local interconnect lines which carry signals traveling in one direction capable of driving other lines which carry signals traveling in opposing directions, according to an embodiment of the present invention.
Figure 14:
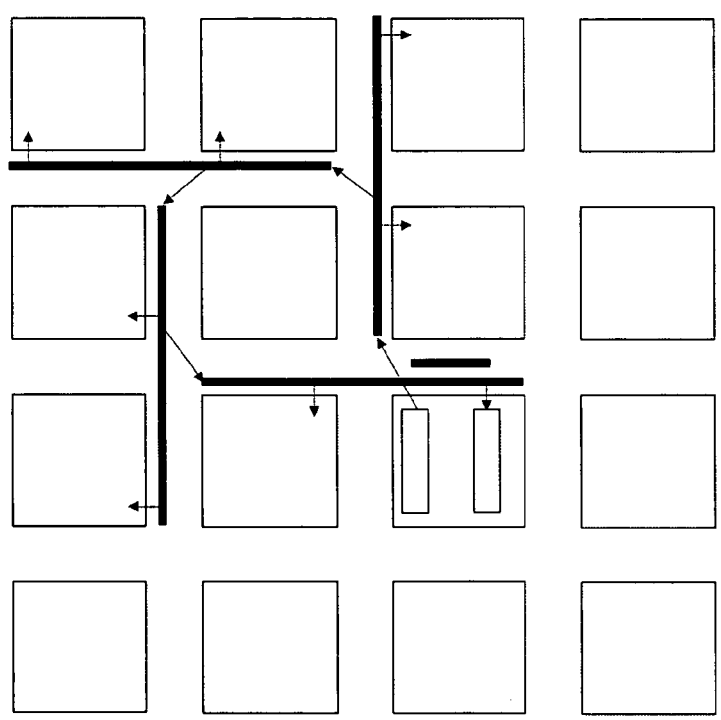
FIG. 14 illustrates an area on an FPGA that includes non-local interconnect capable of routing signals from a LAB, and back to the same LAB, circuitously, prior to the present invention.

FIG. 11 illustrates an area on an FPGA 900 that includes non-local interconnect lines 1110 and 1111. One of these lines is able to drive the other, however the signal directions of the two lines are opposing (a "turn" of more than 90 degrees), according to an embodiment of the present invention. Routing resources in the past were not capable of driving (stitching to) other routing resources that propagate signals in an opposing direction. This practice was suboptimal from a delay minimization perspective. However, when routing to satisfy short-path timing constraints, the ability to "hop" between routing resources which drive signals in opposing directions can be advantageous. It allows the router to add delay to a route without straying too far from the region of the PLD that the end-points (for example, LEs) of the route are located. FIG. 11 illustrates two non-local interconnect lines 1110 and 1111 routing a signal between LE 1101 and 1102, back to the same LAB. Notice that the router is able to stay in the region of the respective LAB because of the "backward-driving" stitches. If wires were only allowed to stitch to other wires for maximum reach (given a certain delay), the router would have to loop around the destination using spirals of routing resources (that take the router away from and back to the destination). FIG. 14 illustrates an exemplary routing situation where spirals of routing resources are implemented.

Figure 12:
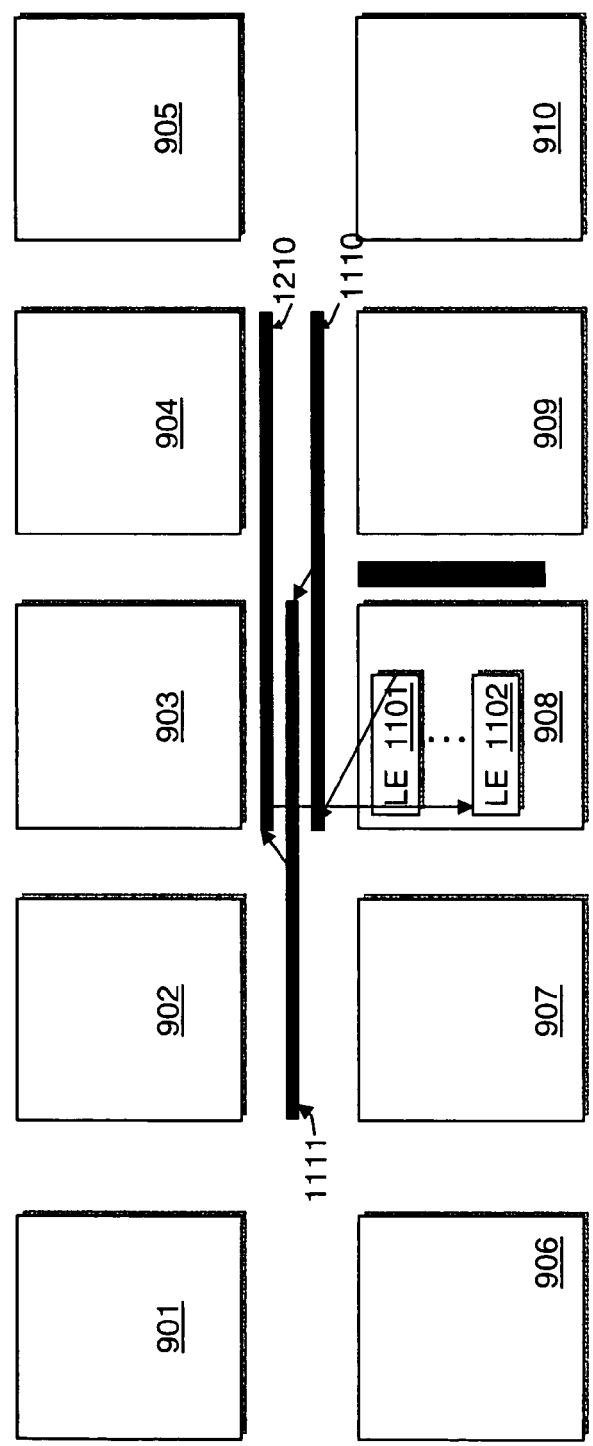
FIG. 12 illustrates an area on an FPGA that includes non-local interconnect lines which carry signals traveling in one direction capable of driving other lines which carry signals traveling in opposing directions, according to a second embodiment of the present invention.

Backward-driving stitches are useful to increase the efficiency and effectiveness of short-path (or short-path and long-path) timing optimization. The efficiency is improved because the router can use just the right amount of non-local interconnect to achieve the delay that it needs to satisfy short-path timing; without these backward-driving stitches, the router might stray from the respective region to add the delay (non-local interconnect lines) necessary to meet short-path timing, and additional wasted lines will be needed to get back to the destination location—this is inefficient. The effectiveness is improved by backward-driving stitches because the router has the flexibility to add just the right amount of delay (down to the granularity of a single wire delay) to meet short-path and long-path timing. FIG. 12 illustrates an area on an FPGA 900 where three non-local interconnect lines (1210, 1111, and 1110) are used to route a connection, and because of backward-driving stitches, the router is able to achieve the necessary delay, while staying in the respective region, such that LE 1102 can be reached. If, instead, non-local interconnect lines were only stitched for maximum reach, the router may not be able to find a set of wires, to achieve the necessary delay, that reach the desired location (because the router will have to route away from and back to the destination). Non-local interconnect lines 1110, 1111, and 1210 may be used to implement some of the non-local interconnect lines shown as 130 in FIG. 1.

Examples have been shown where signals have been transmitted between LEs within a LAB. It should be appreciated that these techniques may also be applied to LEs in different locations, and to other types of blocks (such as RAMs and IOs). Similar techniques can also be applied to other types of routing resources.

Figure 13:
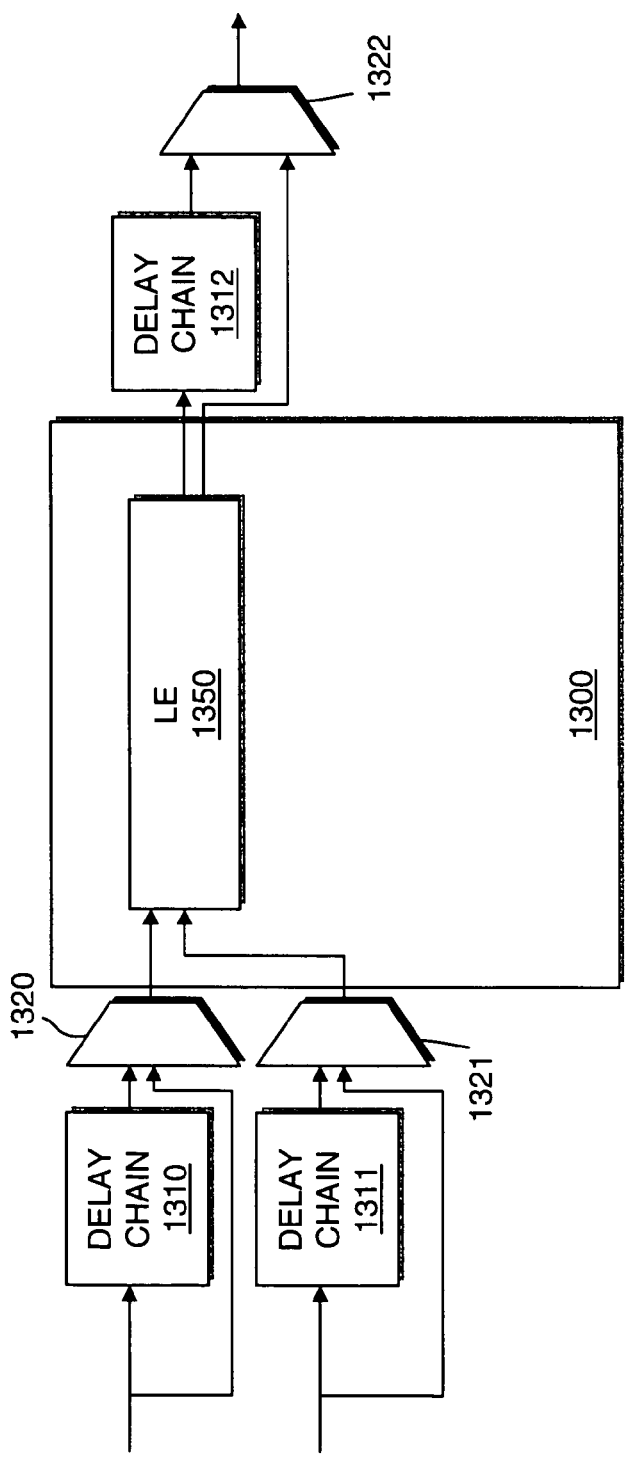
FIG. 13 illustrates a delay chain according to an embodiment of the present invention.

FIG. 13 illustrates delay chains 1310-1312 according to an embodiment of the present invention. In the figure, the delay chains 1310-1312 are coupled to an LE 1350 in a core of an FPGA. In general, the delay chains may be implemented throughout the core area of the FPGA, inside the periphery of where input/output pins reside. The delay chains 1310-1312 may include buffers that operate to delay signal propagation into and out of the LE 1350 in LAB 1300. Each delay chain is coupled to a multiplexer that may select a path through the delay chain or through a non-delayed path. Although each multiplexer 1320-1322 is shown to be coupled to a single delay chain, it should be appreciated that each multiplexer 1320-1322 may be coupled to a plurality of delay chains each having differing delays. Also, the multiplexer may sample points from different stages of a single delay chain to achieve a plurality of delay options. The multiplexer is ultimately used to select the appropriate delay-chain delay for a signal inputted into or outputted from the LE 1350. The appropriate "delay chain settings" can be determined by the router as it routes connections to achieve delays that satisfy short-path and long-path timing. To achieve this, the various delay chain setting options may be appropriately modeled in the routing graph used by the router. The delay chains 1310-1320 may be used in the routing fabric and in/around the blocks to slow down routes throughout the FPGA core illustrated in FIG. 1.

The techniques and FPGA features described with reference to FIGS. 9-13 may be utilized by the routing unit 230 (shown in FIG. 2) to perform routing as described with reference to FIGS. 4-7. It should be appreciated that other routing procedures considering short-path timing constraints can be utilized to make use of the FPGA features (described with reference to FIGS. 9-13). According to an embodiment of the present invention, a first component and a second component in a FPGA may be connected utilizing resources in the FPGA to generate a path with an appropriate amount of delay to satisfy short-path timing constraints. According to one aspect of the present invention, utilizing resources may include selecting resources from a plurality of resources spanning similar distances in differing delays. According to a second aspect of the present invention, utilizing resources may include connecting a first resource to drive a second resource sub-optimally with respect to delay. For example, the first and second resources may highly overlap so as to reduce the distance spanned by a route using the resources. According to a third aspect of the present invention, utilizing resources may include connecting a first resource to drive a second resource, where the first and second resources transmit signals in opposing directions. According to a fourth aspect of the present invention, utilizing resources may include selecting to use a delay element in the core of an FPGA, along with a delay setting for that delay element, if the delay element is programmable.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense. Furthermore, the descriptions have referred to FPGAs and PLDs, however, the techniques and apparatuses are applicable to other logic devices.

What is claimed is:

1. A method for connecting a first and second component in a logic device, comprising:
   generating a path between the first and second components with an appropriate amount of delay to satisfy short-path timing constraints that define a minimum delay on the path by selecting an interconnect line from a plurality of interconnect lines, wherein each of the plurality of interconnect lines spans a same distance on the logic device but transmits a signal with a different delay.

2. The method of claim 1, wherein the interconnect lines are local interconnect lines.

3. The method of claim 1, wherein the interconnect lines are non-local interconnect lines.

4. The method of claim 1, wherein the interconnect lines have differing logic structures generating differing delays.

5. The method of claim 1, wherein the interconnect lines have differing geometries and spacings generating differing delays.

6. The method of claim 1, wherein the interconnect lines have differing process parameters and materials used during construction generating differing delays.

7. The method of claim 1, wherein the interconnect lines have differing fabrication process layers used during construction generating differing delays.

8. The method of claim 1, wherein the interconnect lines have one of different resistive, capacitive, and inductive properties generating differing delays.

9. The method of claim 1, further comprising selecting a second interconnect line to connect with the interconnect line sub-optimally from a delay minimization perspective in order to satisfy the timing constraints.

10. The method of claim 9, wherein the interconnect line and the second interconnect line overlap so as to reduce the distance spanned using the first and the second resources.

11. The method of claim 10, where the interconnect line is a non-local interconnect line and the second interconnect line is a non-local interconnect line that propagates signals in the same direction as the first interconnect line.

12. The method of claim 9, wherein a logical region spanned by the second interconnect line is a subset of a logic region spanned by the interconnect line.

13. The method of claim 12, where the interconnect line is a local interconnect line and the second interconnect line is a local interconnect line.

14. The method of claim 12, where the interconnect line is a non-local interconnect line and the second interconnect line is a local interconnect line.

15. The method of claim 9, wherein the interconnect line and second interconnect line are of the same type.

16. The method of claim 9, wherein the interconnect line and second interconnect line are of differing types.

17. The method of claim 1, further comprising selecting a second interconnect line to connect with the interconnect line, wherein the interconnect line and the second interconnect line transmit signals in opposing directions.

18. The method of claim 17, wherein opposing directions refers to directional differences greater than 90 degrees.

19. The method of claim 17, wherein opposing directions refers to directional differences of 180 degrees.

20. The method of claim 19, wherein the interconnect line is a non-local interconnect line and the second interconnect line is a non-local interconnect line.

21. The method of claim 17, wherein the interconnect line and second interconnect line are of the same type.

22. The method of claim 17, wherein the interconnect line and second interconnect line are of differing types.

23. The method of claim 1, further comprising selecting a delay element in a core of the logic device to connect to the interconnect line.

24. The method of claim 23, wherein the delay of the delay element is programmable.

25. The method of claim 23, further comprising selecting a delay of the programmable delay element.

26. The method of claim 1, wherein the short-path timing constraints comprises hold time requirements.

27. The method of claim 1, wherein the short-path timing constraints comprises minimum propagation delay requirements.

28. The method of claim 1, wherein the short-path timing constraints comprises minimum clock-to-output requirements.

29. A logic device, comprising:
a first resource capable of driving a second resource wherein the first resource and the second resource span a same logical region and a same distance, wherein the first and second resources are routing resources having differing delay.

30. The logic device of claim 29, wherein the first resource is a local interconnect line and the second resource is a local interconnect line.

31. A method for connecting a first component to a second component in a logic device, comprising:
determining minimum and maximum delay budgets for connections along a path between the first component and the second component that satisfy short-path and long-path timing constraints for the path;
selecting a first interconnect line from a first plurality of interconnect lines in response to the minimum and maximum delay budgets, wherein each of the first plurality of interconnect lines spans a same distance on the logic device but transmits a signal with a different delay;
selecting a second interconnect line from a second plurality of interconnect lines in response to the minimum and maximum delay budgets, wherein each of the second plurality of interconnect lines spans a same distance on the logic device but transmits a signal with a different delay; and
connecting the first interconnect line with the second interconnect line to generate the path between the first component and the second component.

32. The method of claim 31, wherein connecting comprises purposely connecting the first interconnect with the second interconnect sub-optimally from a delay minimization perspective in order to satisfy the timing constraints.

33. The method of claim 31, wherein connecting comprises connecting the first interconnect line and the second interconnect line such that they overlap to reduce the distance spanned.

34. The method of claim 31, wherein the first interconnect line and the second interconnect line transmit signals in opposing directions.

* * * * *